United States Patent
Groholski et al.

(10) Patent No.: US 11,261,527 B2
(45) Date of Patent: Mar. 1, 2022

(54) METHOD AND APPARATUS FOR PRECURSOR GAS INJECTION

(71) Applicant: MEO Engineering Company, Inc., Methuen, MA (US)

(72) Inventors: Alexander Groholski, Methuen, MA (US); Valery Ray, Methuen, MA (US); Joseph Favata, Methuen, MA (US)

(73) Assignee: MEO Engineering Company, Inc., Methuen, MA (US)

( * ) Notice: Subject to any disclaimer, the term of this patent is extended or adjusted under 35 U.S.C. 154(b) by 0 days.

(21) Appl. No.: 16/991,871

(22) Filed: Aug. 12, 2020

(65) Prior Publication Data

US 2021/0047731 A1    Feb. 18, 2021

Related U.S. Application Data

(60) Provisional application No. 62/885,795, filed on Aug. 12, 2019, provisional application No. 63/035,074, filed on Jun. 5, 2020.

(51) Int. Cl.
*C23C 16/448*    (2006.01)
*C23C 16/455*    (2006.01)

(52) U.S. Cl.
CPC ............................ *C23C 16/45574* (2013.01)

(58) Field of Classification Search
CPC ................. C23C 16/45574; C23C 16/4485
See application file for complete search history.

(56) References Cited

U.S. PATENT DOCUMENTS

| | | | |
|---|---|---|---|
| 5,435,850 A | 7/1995 | Rasmussen | |
| 5,451,260 A | 9/1995 | Versteeg et al. | |
| 5,851,413 A | 12/1998 | Casella et al. | |
| 6,497,194 B1 | 12/2002 | Libby et al. | |
| 8,394,454 B2 | 3/2013 | Kruger et al. | |
| 8,853,078 B2 | 10/2014 | Botman et al. | |
| 9,090,973 B2 | 7/2015 | Randolph et al. | |
| 9,150,961 B2 | 10/2015 | Chandler et al. | |
| 2003/0121608 A1* | 7/2003 | Chen .................. | C23C 16/45563 156/345.33 |
| 2009/0223451 A1 | 9/2009 | Kruger et al. | |
| 2009/0263578 A1* | 10/2009 | Lindfors ........... | C23C 16/45544 427/248.1 |
| 2011/0114665 A1 | 5/2011 | Chandler et al. | |

(Continued)

FOREIGN PATENT DOCUMENTS

WO    WO2004/070801    *    8/2004

OTHER PUBLICATIONS

Okabe WO_2004070801_A1_I Aug. 2004 Eng translation (Year: 2004).*
International Search Report in International Patent Application No. PCT/US20/45988 dated Nov. 23, 2020.

*Primary Examiner* — Joseph A Miller, Jr.
(74) *Attorney, Agent, or Firm* — Greenberg Traurig, LLP; Roman Fayerberg; Jaime Burke

(57) ABSTRACT

The present disclosure provides a gas injection system that can include a housing configured to hold a plurality of precursor cartridges comprising one or more precursor materials, and a nozzle extending from the housing, the nozzle having a tip configured for insertion into a sample chamber of a material processing apparatus. The precursor cartridges are fluidly connected to the nozzle to selectively deliver one or more precursor gasses to the sample chamber.

13 Claims, 27 Drawing Sheets

(56) References Cited

U.S. PATENT DOCUMENTS

| | | |
|---|---|---|
| 2013/0019960 A1 | 1/2013 | Choi et al. |
| 2013/0248490 A1 | 9/2013 | Rasmussen et al. |
| 2016/0155607 A1 | 6/2016 | Rasmussen et al. |
| 2018/0202043 A1 | 7/2018 | Sasaki et al. |
| 2019/0096738 A1 | 3/2019 | Okajima et al. |

* cited by examiner

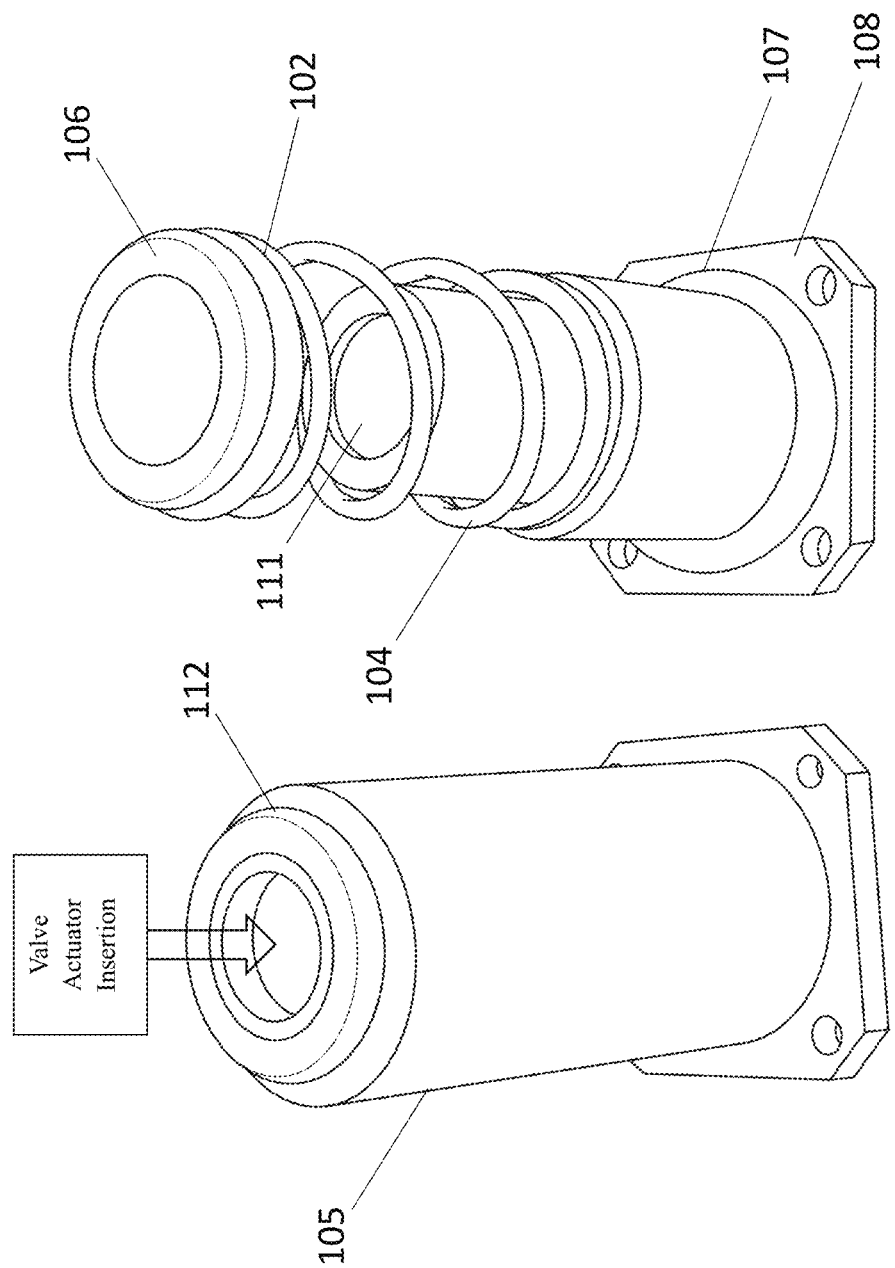

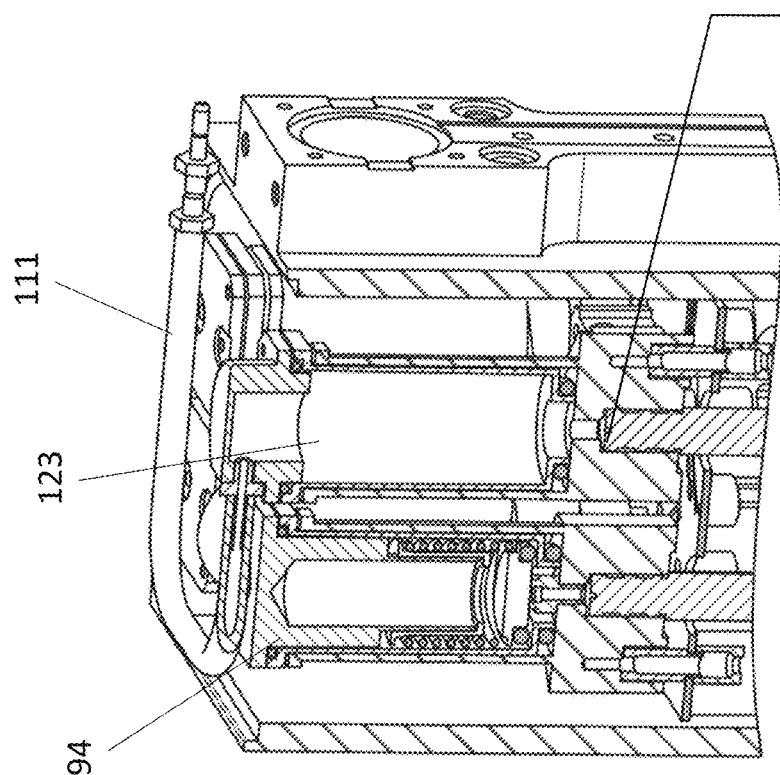
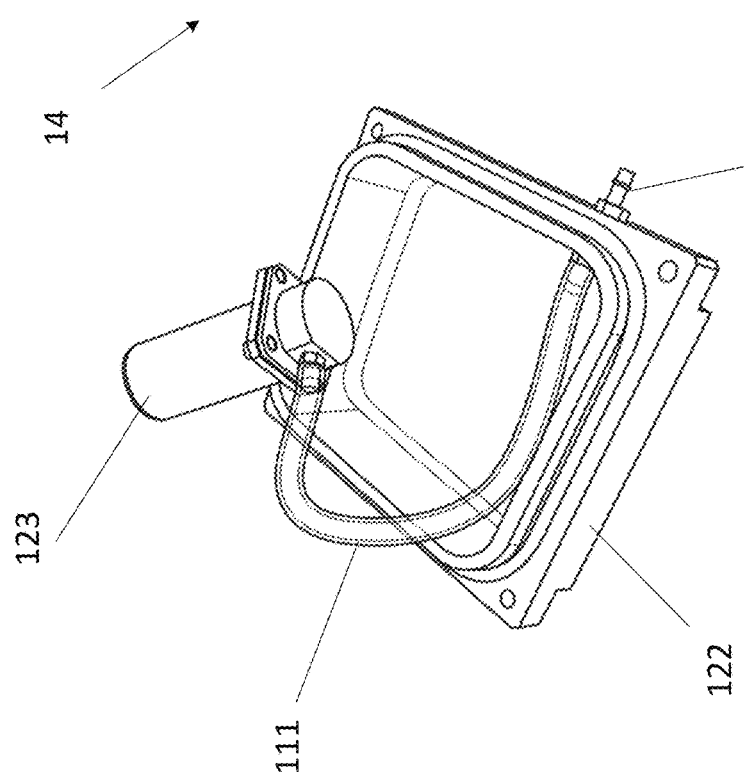
FIG. 6A
FIG. 6B

METHOD AND APPARATUS FOR PRECURSOR GAS INJECTION

RELATED APPLICATIONS

This application claims the benefit of and priority to U.S. Provisional Application No. 63/035,074 filed Jun. 5, 2020 and U.S. Provisional Application No. 62/885,795 filed Aug. 12, 2019, and the contents of both of these applications are hereby incorporated herein by reference in their entireties.

FIELD

The present disclosure generally relates to gas injection systems.

BACKGROUND

Among other uses, Focused Ion Beam (FIB) systems, electron beam systems such as Scanning Electron Microscope (SEM), dual-beam FIB/SEM systems, and other systems based on a laser beam are used for deposition of chemical compounds on a surface of a sample via beam-induced deposition. Briefly, a precursor gas containing the desired chemical compound, or combination of gases capable of producing the desired compound as a result of the chemical reaction, is/are introduced into the sample chamber of the instrument, where the precursor gas is undergoing decomposition or chemical reaction induced by the corresponding beam and depositing the desired compound on the surface of the sample. The FIB, SEM, dual-beam FIB/SEM, and laser-based system can utilize a gas injection systems (GIS) to deliver a precursor gas into the sample chamber. Gas precursors are also used for gas assisted etching (GAE) induced by ion, electron, and laser beams.

Oftentimes, it may be necessary to introduce different precursor gasses during the deposition or GAE process. There is a need to provide a gas injection system that can handle multiple precursor gases, provides short switching times between precursors, is easy to set up, and requires minimal handling of the chemicals.

SUMMARY

The present disclosure is directed to systems, methods and devices relating to a gas injection system. In some embodiments, a gas injection system can include a housing configured to hold a plurality of precursor cartridges comprising one or more precursor materials, and a nozzle extending from the housing, the nozzle having a tip configured for insertion into a sample chamber of a material processing apparatus. The precursor cartridges are fluidly connected to the nozzle to selectively deliver one or more precursor gasses to the sample chamber.

In some embodiments, the housing includes a plurality of cartridge housings configured to accept the precursor cartridges. Each cartridge housing can include an integrated valve to fluidly connect the precursor cartridge disposed in the cartridge housing to the nozzle. In some embodiments, the housing can form a vacuum envelope around the plurality of precursor cartridges. In some embodiments, each of the plurality of cartridge housing includes one or more temperature control elements configured to operate independently from one or more heating elements associated with other cartridge housings to maintain each of the plurality of precursor cartridges at a temperature selected for sublimation of the precursor gas in that precursor gas cartridge.

In some embodiments, the plurality of precursor cartridges are fluidly connected in series to one or more delivery lines in fluid communication with the nozzle and the sample chamber. In some embodiments, the system can also include a plurality of three-way valves to fluidly connect the plurality of precursor cartridges to the one or more delivery lines in sequence. In some embodiments, the one or more delivery lines are thermally controlled to prevent condensation of the precursor gas in the one or more delivery lines. In some embodiments, the one or more delivery lines are fluidly connected to one or more injection capillaries disposed in the nozzle for delivery of the precursor gas to the sample chamber. The nozzle can include multiple injection capillary for simultaneous injection of multiple precursors into the sample chamber. In some embodiments, the nozzle is configured to be maintained at a thermal gradient along a length of the nozzle. The temperature can increase toward the tip of the nozzle. In some embodiments, the nozzle and the housing are configured to form a vacuum envelope around the precursor cartridge and the one or more delivery lines.

The present disclosure is also directed to a method for delivering a plurality of precursor gases into a sample chamber of a material processing apparatus. The method includes inserting a gas injection system into the material processing apparatus. The gas injection system can include a housing configured to hold a plurality of precursor cartridges comprising one or more precursor materials, and a nozzle extending from the housing. The nozzle can have a tip configured for insertion into the sample chamber, and the precursor cartridges can be fluidly connected to the nozzle. The method also includes forming a vacuum in the housing around the plurality of precursor cartridges, individually heating the plurality of gas precursor cartridges to a temperature sufficient to produce one or more precursor gasses from the one or more precursor materials, and selectively delivering one or more precursor gasses to the sample chamber from the plurality of gas precursor cartridges.

In some embodiments, the method can also include heating the gas injection system to a temperature sufficient to prevent condensation of the one or more precursor gasses and maintaining such temperature. In some embodiments, the nozzle is configured to be maintained at a thermal gradient along a length of the nozzle.

In some embodiments, the housing includes a plurality of cartridge housings configured to accept the precursor cartridges. Each cartridge housing can include an integrated valve to fluidly connect the precursor cartridge disposed in the cartridge housing to the nozzle. In some embodiments, the plurality of precursor cartridges are fluidly connected in series to one or more delivery lines in fluid communication with the nozzle and the sample chamber. The system can further include a plurality of three-way valves to fluidly connect the plurality of precursor cartridges to the one or more delivery lines in sequence. In some embodiments, the one or more delivery lines are thermally maintained to prevent condensation of the precursor gas in the one or more delivery lines. The one or more delivery lines can be fluidly connected to one or more injection capillaries disposed in the nozzle for delivery of the precursor gas to the sample chamber.

BRIEF DESCRIPTION OF THE DRAWINGS

FIGS. 4A and 4B illustrate an exemplary embodiment of a cartridge suitable for use in a GIS system of the present disclosure;

FIG. 6A illustrates a cover of a GIS body with a fitting for connecting gas cartridge to a gas line;

FIG. 6B illustrates a position of a $3^{rd}$ cartridge with precursor cartridge and $4^{th}$ cartridge with the precursor cartridge and a gas line;

Figure 1A:
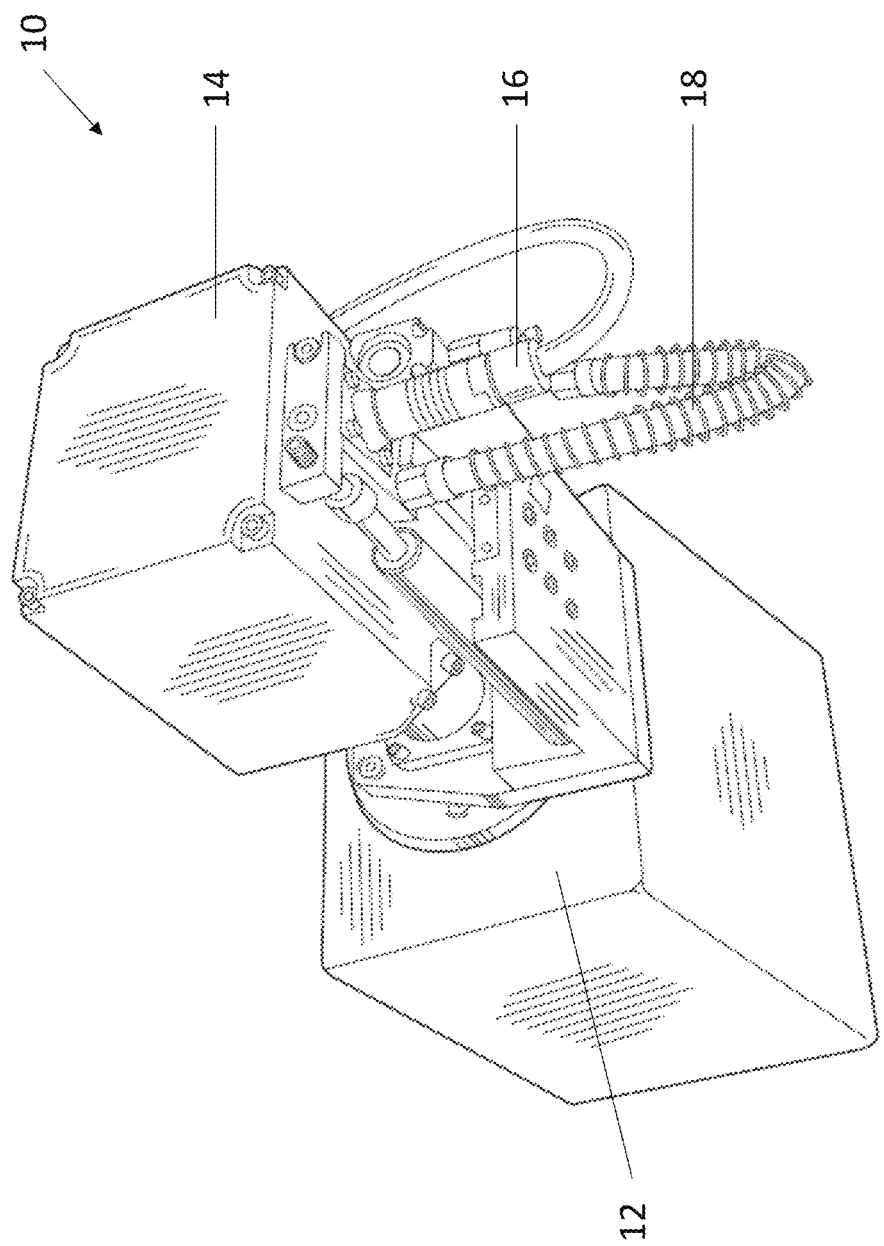
FIG. 1A is an exemplary embodiment of a gas injection system (GIS) of the present disclosure mounted on a main chamber of the instrument.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The purpose of a gas injection system (GIS) of the present disclosure is to enable usage of volatilized agents and improve efficiency of sample processing by delivering controlled quantities of reactive substances for the release in proximity to the sample processing area. In accordance with some embodiments of the present disclosure, a chemical precursor or multiple chemical precursors can be delivered from within self-sealing precursor cartridges contained within an isolated envelope surrounding all internal components of the apparatus. The flow rate and phase stability of these delivered precursors is managed by temperature control elements in thermal contact with the precursor cartridge housing, and through differential heating of the entire delivery path from precursor source to the terminus of the nozzle. Arrangement of precursor cartridge ports, valves, a shared delivery line, and pump-down ports supports continuous and efficient delivery, delivery line purging and cleaning, and continuous evacuation during idle periods.

In some embodiments, in the GIS of the present disclosure, multiple compatible precursor species can be loaded via independent cartridges at a given time and kept outside the sample chamber of the instrument, but still within the internal vacuum of the GIS body. Thus the GIS of the present disclosure enables the processing of samples with different precursor species with single gas injector, eliminating the need for multiple GIS and eliminating the need for any adjustments upon the change of precursor material. Replacement of depleted precursor cartridges on the GIS of present disclosure is possible without breaking vacuum in, or accessing the main sample chamber of an FIB, SEM, or similar instruments. In some embodiments, the GIS of the present disclosure provides continuous heating directly at the cartridge housing and through thermal sheathing at all points throughout the precursor flow path. This continuous heating coupled with heat measurement at the farthest from the heating element location on the precursor cartridge, integration of heating control with a feedback loop can prevent downstream condensation and/or solidification of the precursor within the GIS due to cooling of the precursor. Independent heating of each cartridge with chemical precursor can enable independent control of vapor pressure for each precursor, thus facilitating regulation of the flow rate. In some embodiments, the design of the GIS of the present disclosure incorporates differential heating of the injection nozzle, with heaters located near the tip and at the back of the delivery line. Differential heating across these heating elements creates temperature gradient along the delivery line, preventing precursor condensation. As all points of the delivery line are held at the temperature higher than the condensation temperature of the gaseous phase of the precursor material, said heating is facilitating effective outgassing of the residual precursor from within the tube. In some embodiments, the GIS of the present disclosure has heating elements directly affixed to the precursor cartridges of the GIS providing direct heating to the areas which makes the heat transfer process more efficient and enables rapid feedback control.

In some embodiments, the GIS of the present disclosure is configured to prevent condensation of the precursor within delivery lines and therefore suitable for precursors with low vapor pressure and precursors with significant vapor pressure, which may be solid, liquid, or gaseous at ambient temperature conditions. In some embodiments, the system is thermally controlled to maintain the system at a desired temperature to prevent the condensation of vapor within the system, using for one or more temperature or thermal control elements, such as, for example, heaters, heat exchangers, heat spreaders, thermally conductive or insulating sheath, and other similar temperature control devices. In some embodiments, the GIS of the present disclosure possesses a single nozzle that does not have segments extending at different angles and therefore is able to deliver multiple precursors without any changes of GIS position or the need for adjustments to the ion or electron beam processing the sample.

In some embodiments, the GIS of the present disclosure does not require carrier gas for precursor delivery. Precursor flow from cartridge to the injection capillary is facilitated by vapor pressure of the precursor within the heated cartridge and supported by continuous heating of the flow path and temperature gradient from differential heating along delivery line within the nozzle. In some embodiments, the GIS of the present disclosure is configured with three-way valves at each precursor cartridge so that when the valve is closed at a precursor cartridge, purging can occur without additional valve actuation. The GIS of the present disclosure can also provide constant back pumping of the internal gas envelope at all times when the precursor is not being injected, and constant back pumping of inactive portion of the gas delivery envelope at all times, with exhaust into the dedicated evacuation port or main chamber of the instrument. In some embodiments, the GIS of the present disclosure is based on contiguous delivery path with serial arrangement of three-way valves, eliminating manifold altogether and enabling rapid switching between precursors with cross-contamination reduced by constant back-pumping and, if needed, then completely eliminated by a clean-up cycle with purging.

In some embodiments, the GIS of the present disclosure is configured such that all precursor species, typically in the form of a solid or liquid, are contained within the vacuum envelope of the GIS body. In some embodiments, gaseous substances, chemically-active or inert, may also be injected via gas cartridge and/or from outside the GIS housing. The vacuum envelope, serves as a safety enclosure for all precursors, providing isolation in the event of a leak at the precursor source and elements enclosed within the GIS body. In some embodiments, the precursors can be heated directly at the precursor cartridge with differential heating along the gas line up to the terminus of the nozzle to control the flow rate of precursor delivery, without any need for additional means of flow control. Continuous heating of the flow path and thermal gradient along the delivery line of the GIS of the present disclosure can prevent condensation and/or solidification of the precursor downstream from the precursor source.

In some embodiments, the GIS of the present disclosure is configured so precursor species can be introduced to the sample processing space wherein the presence of beam irradiation provides the conditions for processing, with or without the presence of an additional activator chemical. In some embodiments, the GIS of the present disclosure can be utilized with a variety of precursor gases and within a multitude of focused beam instruments.

In some embodiments, the GIS of the present disclosure provides continuous heating directly at the cartridge housing and through thermal sheathing at all points throughout the precursor flow path. This continuous heating coupled with heat measurement at the farthest point from the heating element location on the precursor cartridge, integration of heating control with a feedback loop prevents downstream condensation and/or solidification of the precursor within the GIS due to cooling of the precursor. Independent heating of each cartridge with chemical precursor enables independent control of gaseous phase for each precursor, thus facilitating regulation of the flow rate. The design of the GIS of the present disclosure can incorporate differential heating of the nozzle, with heaters located near the tip and at the back of the delivery line. Differential heating across these heating elements creates temperature gradient along the delivery line or tube, preventing precursor condensation. In some embodiments, all points of the delivery line are held at the temperature higher than any of the precursor cartridges, and said heating is facilitating effective outgassing of the residual precursor from within the tube. In some embodiments, the GIS of the present disclosure has heating elements directly affixed to the precursor cartridges or cartridge housings of the GIS providing direct heating to the areas which makes the heat transfer process more efficient and enables rapid feedback control. In some embodiments, the instant design is able to prevent condensation of the precursor within delivery lines and therefore suitable for precursors with low and with significant vapor pressure which may be solid, liquid, or gaseous at ambient temperature conditions.

In some embodiments, the GIS of the present disclosure does not require carrier gas for precursor delivery. Precursor flow from cartridge to the delivery line is facilitated by vapor pressure of the precursor material within the heated cartridge and supported by continuous heating of the flow path and temperature gradient from differential heating along delivery line and nozzle. The precursor material may be in a solid or liquid form, or in a gaseous form. In some embodiments, the GIS of the present disclosure is configured with three-way valves at each precursor cartridge so that when the valve is closed at a precursor cartridge, purging can occur without additional valve actuation. The GIS of the present disclosure can also provide constant back pumping of the internal gas envelope at all times when the precursor is not being injected, and constant back pumping of inactive portion of the gas delivery envelope at all times, with exhaust into the dedicated evacuation port or main chamber of the instrument. The GIS of the present disclosure design is based on contiguous delivery path with serial arrangement of three-way valves, eliminating manifold altogether and enabling rapid switching between precursors with cross-contamination reduced by constant back-pumping and, if needed, then completely eliminated by a purge clean-up cycle.

The GIS of the present disclosure has all precursor species, typically in the form of a solid or liquid, contained within the vacuum envelope of the GIS body. Said vacuum envelope can serve as a safety enclosure for all contained precursors, providing isolation in the event of a leak at the precursor source. Additionally, the precursors are thermally controlled directly at the precursor cartridge with differential heating along the gas line up to the terminus of the nozzle to control the flow rate of precursor delivery, without any need for additional means of flow control. Continuous heating of the flow path and thermal gradient along the delivery line of the GIS of the present disclosure can prevent condensation and/or solidification of the precursor downstream from the precursor source.

In some embodiments, methods of gas-assisted processes can include local activation of spontaneous reaction on a sample surface between precursor and activator chemicals even after discontinuing beam irradiation, but the GIS of the present disclosure is not limited to this method of depositing or removing material in any configuration. Precursor species can be introduced to the sample processing space wherein the presence of beam irradiation provides the conditions for processing, with or without the presence of an additional activator chemical. In some embodiments, organometallic chemicals such as, for example, methylated and/or ethylated metals such as hexamethylditin for ion beam deposition may be used, yielding very low-resistivity deposition patterning. The GIS of the present disclosure can utilize these precursors in some embodiments, but is not limited to their sole use. Similarly, the GIS of the present disclosure would be utilized within a multitude of focused ion, electron, and laser beam instruments.

An exemplary embodiment of a gas injection system 10 is shown in FIG. 1A. In some embodiments, as shown in FIG. 1A, in the GIS of the present disclosure, multiple chemically compatible precursor species are loaded via independent cartridges at a given time into a GIS body 14 and kept outside the sample chamber 12 of a material processing instrument, for example, scanning electron microscope (SEM), a focused ion beam (FIB) instrument, dual-beam FIB/SEM, laser-beam based instrument or similar instruments, but still within the internal vacuum of the GIS body 14. Thus the GIS of the present disclosure 10 enables the processing of samples with different precursor species with a single gas injector that can be mounted on the sample chamber 12, eliminating the need for multiple GIS and eliminating the need for any adjustments upon the change of precursor material. Replacement of depleted precursor cartridges on the GIS of the present disclosure is possible without breaking vacuum or otherwise disturbing environment in the main sample chamber of FIB, SEM or similar instrument. The system 10 can also include an electrical connection 16 to a controller, and a pumping line 18, as shown in FIG. 1A.

Figure 1B:
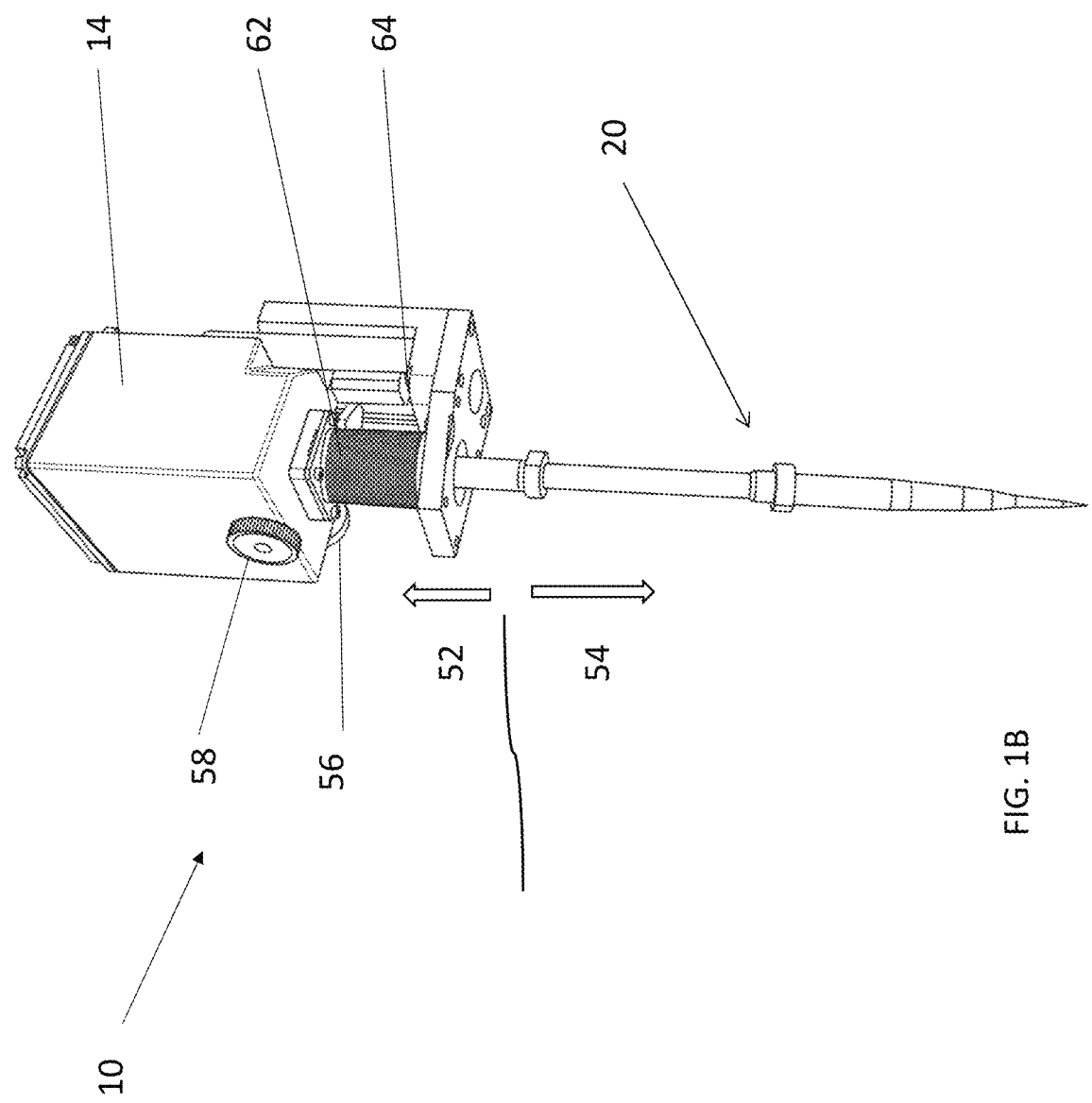
FIG. 1B is an exemplary embodiment of a gas injection system of the present disclosure.

The instant gas injection system, as, for example, shown in FIG. 1B, is a complete multi-chemistry GIS. The GIS system 10 shown in FIG. 1B includes an ambient atmosphere environment portion 52 and an instrument chamber environment portion 54. For use, the apparatus is mounted onto an instrument with the instrument chamber portion 54 being housed inside the instrument's chamber 12, with the portion 52 remaining external to the instrument as shown in FIG. 1A.

The GIS system 10 further includes the GIS housing or body 14 that is configured to house precursor cartridges. In some embodiments, the GIS body 14 can have a shape of a cube (a.k.a. "cube"), but can have other shapes as well. The GIS body houses the internal components of the system, including multiple precursor cartridges. Inside the sealed GIS body, the chemical precursors are contained for both safety and performance purposes. The sealing of the GIS body provides a failsafe in the event that there is unexpected leakage from any of the internal cartridges or plumbing. Because the GIS body is also kept at vacuum pressure, the heat transfer from the cartridges and plumbing is well insulated for reliable temperature control. This vacuum insulation ensures that GIS body remains at, or at nearly the room temperature, while internally located elements are heated. In some embodiments, the GIS housing 14 is maintained under vacuum to correspond to the vacuum of the instrument chamber 12. In some embodiments, the GIS housing 14 is maintained under vacuum by a dedicated pump through the vacuum line 18. Because the GIS housing is sealed off from the sample chamber 12, when necessary, the precursor cartridges can be exchanged without breaking the vacuum of the sample chamber 12 or disturbing internal environment of the sample chamber 12.

Figure 1C:
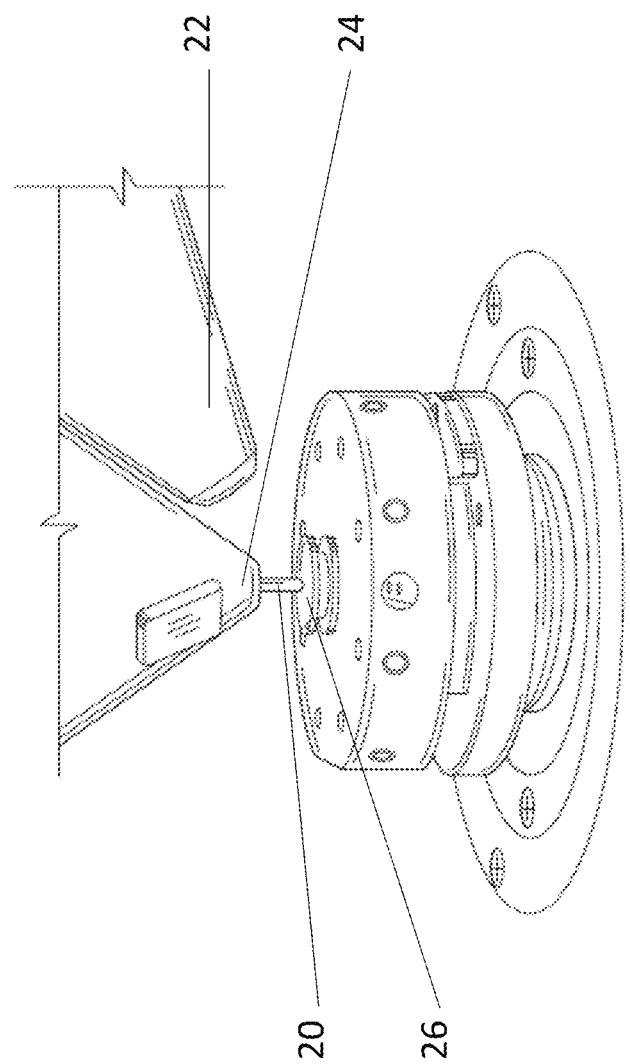
FIG. 1C is an embodiment of an internal environment of a dual-beam FIB/SEM instrument with a GIS inserted and gas release capillary in immediate proximity to sample processing area.
Figure 1D:
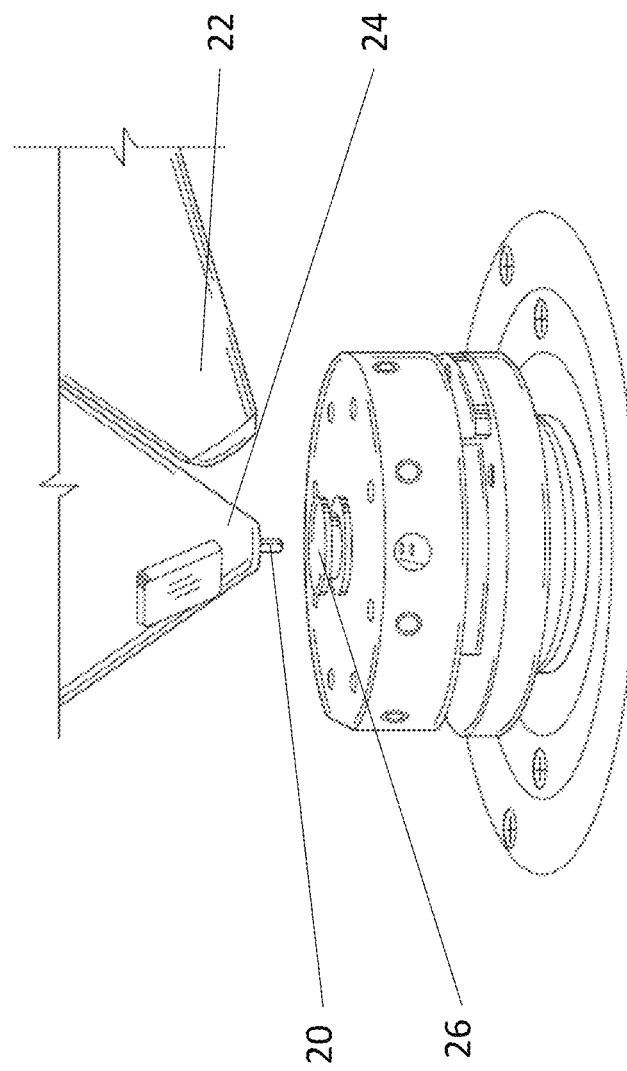
FIG. 1D is an embodiment of an internal environment of a dual-beam FIB/SEM instrument with GIS retracted and gas release capillary on safe distance away from sample processing area.

In some embodiments, the GIS of the present disclosure possesses a single nozzle 20 to deliver multiple precursors from the GIS housing 14. This can enable the delivery of various precursors without any changes of GIS position or the need for adjustments to the ion beam or an electron beam from an ion beam source 22 or electron beam source 24 processing the sample, as shown in FIGS. 1C and 1D. Directing precursors from a single nozzle can eliminate the need to change the position of the tip of the nozzle 20 in order to direct different chemicals to the area of interaction between an ion beam from an ion beam source 22 or electron beam from electron source 24 and material of the substrate positioned on a sample processing area 26. Referring back to FIG. 1F, the system 10 can further include a nozzle adjustment knob 56 in the X-direction, a nozzle adjustment knob 58 in the Y-direction that enable the adjustment of the position of the nozzle relative to the ion beam or the electron beam.

During operation, the nozzle 20 of the GIS system 10 can be inserted into the sample chamber 12, and the GIS system 10 can be secured in place using the mounting bracket 64. The nozzle 20 can move from a retracted position, shown in FIG. 1D, to an inserted position, shown in FIG. 1C, near the sample workspace. Vacuum bellows 62 facilitate such motion, while preserving integrity of internal vacuum environment.

Figure 1E:
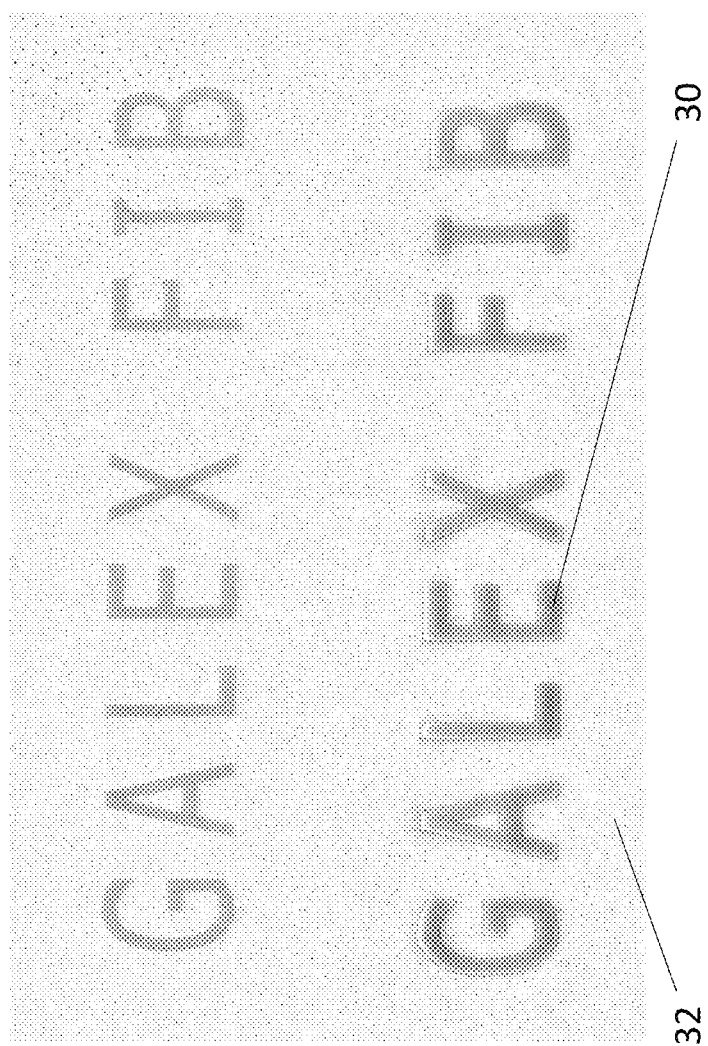
FIG. 1E is an example of carbon material deposited via ion-beam induced decomposition from volatilized naphthalene delivered by GIS to the sample processing area.
Figure 1F:
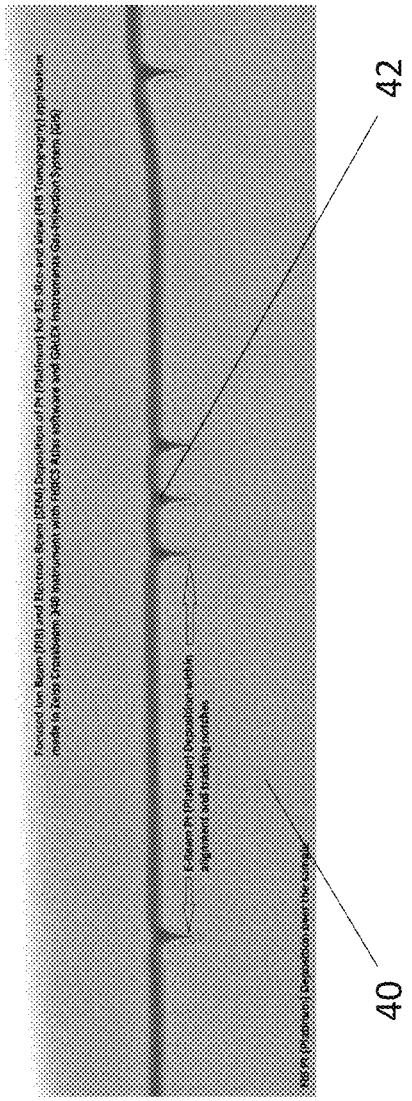
FIG. 1F is a cross-sectional view of an example of platinum material deposited via ion-beam and electron-beam induced decomposition of organometallic precursor delivered by GIS to the sample processing area.

FIG. 1E shown an example of carbon material 30 deposited via ion-beam induced decomposition from volatilized naphthalene delivered by GIS to the sample processing area (a substrate 32). FIG. 1F shows cross-sectional view of an example of platinum material 40 deposited via ion-beam and platinum material 42 deposited via electron-beam induced decomposition of organometallic precursor delivered by GIS to the sample processing area. Once the device is inserted, the GIS delivers the precursor to the sample workspace within the sample chamber for processing with a particle beam. Operation of the precursor delivery including valve actuation, precursor selection, and GIS insertion are all managed by the user through a controller and PC-software.

As described above, the GIS body 14 is kept under vacuum during the operation of the GIS system. The GIS body can be pumped down to a vacuum pressure in a variety of ways. In some embodiments, a nozzle can be used that can reside in the sample chamber. In some embodiments, the nozzle that serves to deliver the precursor can also serve as an opening to evacuate the internal lines and volume of the GIS into the vacuum of the sample chamber, when no actively depositing precursor. In some embodiments, one or more ports can be positioned on the GIS body where a line can be run to an exterior pump or to vacuum chamber of the instrument.

Figure 2:
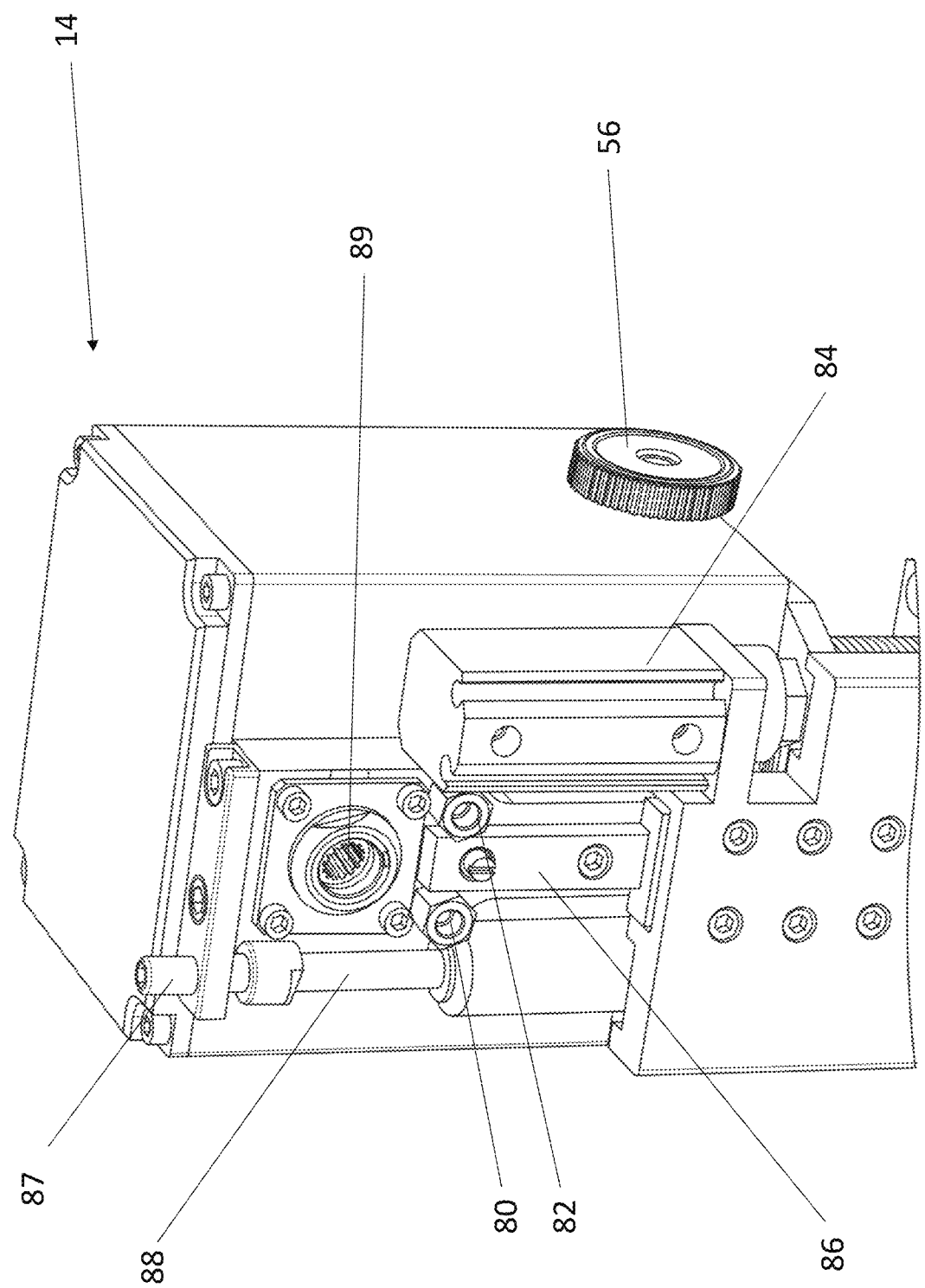
FIG. 2 illustrates an exemplary embodiment of a GIS body of a gas injection system of the present disclosure.

In reference to FIG. 2, the GIS body N includes ports 80, 82 where a vacuum line can be attached. The use or disuse of these ports can be configured in a number of ways depending on if constant back pumping of the internal gas tube is desired and which of the two pumping methods is chosen. In short, if the GIS body 14 can be pumped into the main chamber of the SEM/FIB instrument and there is no back-pumping for the internal gas tube while all injection valves are closed, then there would be no vacuum ports used at the bottom of the GIS body. If the GIS body is pumped into the main chamber of the instrument and there is back pumping for the internal gas tube while all injection valves are closed, then there would be one vacuum port used on the bottom of the GIS body. If the GIS body is pumped through a separate vacuum line and there is no back-pumping for the internal gas tube while all injection valves are closed, then there would be one vacuum port used on the bottom of the GIS body. And lastly, if the GIS body is pumped through the separate vacuum line and there is back-pumping of the internal gas tube, then there would be two vacuum ports used on the bottom of the GIS body.

As is further shown in FIG. 2, an air cylinder 84 is disposed on the GIS body 14. The air cylinder 84 may receive compressed gas for the extension and retraction of the nozzle with adjustable speed.

The linear movement of the nozzle can be controlled with two cylinder-actuators shown in FIG. 2. In some embodiments, an air-spring cylinder provides just enough force to overcome atmospheric pressure acting on the apparatus. This means that the apparatus will be fully retracted when in the home position or if damage to the compressed air line occurs, protecting itself and other components from collisions. During points of operation, an air cylinder controls the extension and retraction of the nozzle with adjustable speed. When the GIS is to be utilized for sample processing, the nozzle will extend to the sample workspace from a retracted position in the instrument chamber via the air cylinder. When processing with the GIS is completed, the GIS can be retracted by the same air cylinder to free up the workspace around the sample and protect the apparatus.

The GIS body can further include an insertion linear guide 86 and a retraction air spring 88 to assist with the movement of the nozzle or the GIS housing in relation to the instrument. The GIS body 14 further includes a communication and power connection port 89 to provide connection to a printed circuit board (PCB) that enable the operation of electrical components of the GIS system 10. In some embodiments, fine tuning of the depth of insertion may be provided by adjustment of the setscrew 87 on the back of the airspring 88. In some embodiments, the airspring can only be compressed as far as its shaft is completely inserted and comes to a hard stop. Position of the GIS body relatively to the hard-stopped position of the airspring shaft is adjustable via set-screw 87.

Figure 3B:
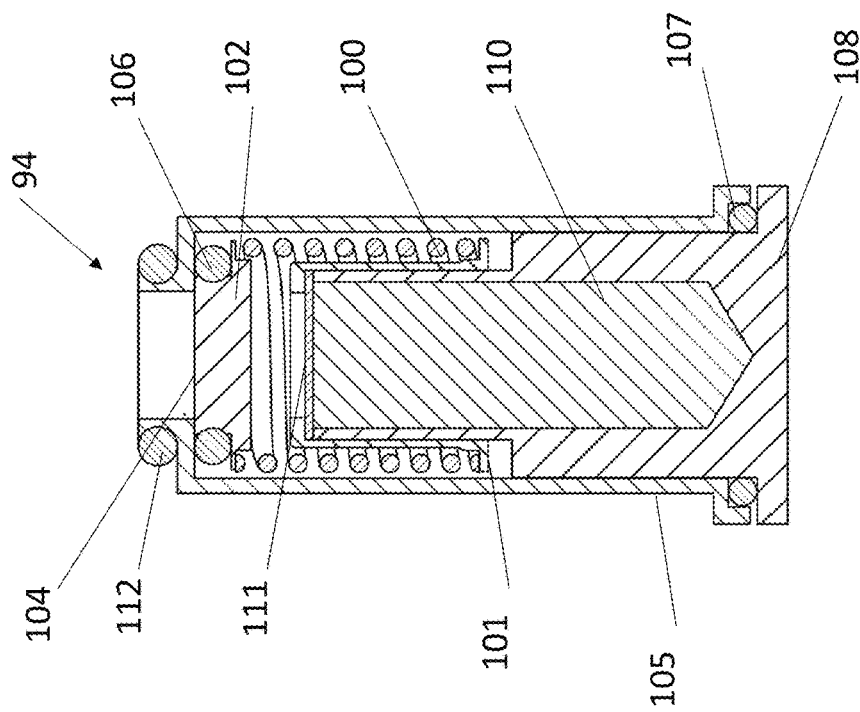
FIG. 3B is a cross-sectional view of a cartridge suitable for use in a GIS system of the present disclosure.
Figure 3A:
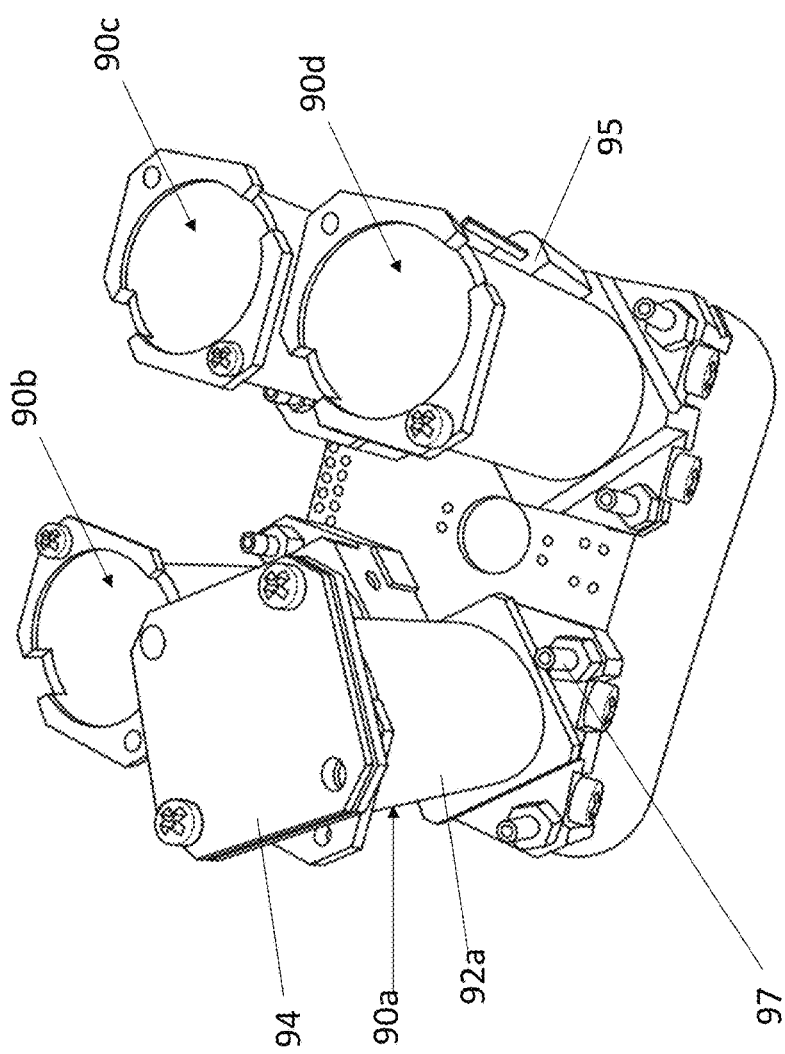
FIG. 3A illustrates an exemplary cartridge housing with one cartridge inserted.

In reference to FIGS. 3A and 3B, cartridge with the chemical precursors are housed in a compact array of ports. In some embodiments, multiple cartridge ports 90a, 90b, 90c, 90d can be provided on a base of the GIS body. Each port 90a, 90b, 90c, 90d can include a cartridge housing 92a, 92b, 92c, or 92d, respectively, configured to accept a precursor cartridge 94. One or more temperature control devices 95 can be provided to vaporize the precursor. In some embodiments temperature control device 95 may be resistive heater. In some embodiments temperature control device 95 may be thermoelectric heat transfer element, such as Peltier or other device. In some embodiments, a temperature control device can be located at the valve of each cartridge port. The system further includes one or more precursor flow and pumping ports 97 that fluidly connect the injection nozzle located within the sample chamber to the precursor cartridge to enable the delivery of the precursor gas to the sample chamber. The cartridge ports 90a-90d are formatted for easy cartridge replacement.

FIGS. 3B, and 4A-4B provide an exemplary embodiment of a self-sealing cartridge. In some embodiments, such cartridge assembly can be used for non-corrosive solid and liquid precursors. However, it should be noted that cartridges with gaseous substances can also be used. As shown in FIG. 3B, the precursor cartridge incudes a cartridge body 105, a cartridge base 108 and a precursor internal volume or reservoir 110, which is designed to hold the precursor material. A body O-ring 107 may be provided to form a seal around the cartridge base 108. In some embodiments, the cartridge comes to a user with a liquid or a solid precursor material preloaded into the internal volume 110. The liquid or solid phase of the precursor material can be retained within the internal volume 110 by a gas-permeable barrier 111, which allows transfer of the gaseous phase of the precursor. For example, filter media compatible with the precursor material can be used as the gas permeable barrier.

In some embodiments, the cartridge 94 further includes a spring 100 retained by a retention bussing 101. When the spring 100 is compressed, the spring 100 is configured to apply pressure on the plunger 102 which in turn compresses the internal O-ring 106, which is effective to hermetically seal the precursor in internal volume 110 and gaseous phase within the cartridge. When the cartridge is inserted into the cartridge housing, the plunger 102 comes in contact with a cartridge valve actuator depicted in FIG. 7B, however the cartridge remains sealed by the plunger 102 and the compressed O-ring 106. When the cartridge is fastened to the cartridge housing by one or more retention screws, the action of the screw thread pushes the cartridge further into the cartridge housing. The cartridge valve actuator can be configured to act upon the plunger 102 to overcome the force of the spring 100, moving the plunger 102 with the internal O-ring away from the cartridge body. At the same time the O-ring 112 comes in contact with bottom of the cartridge housing and is compressed by the action of fastening the cartridge to the cartridge housing, creating a seal. As the result of opening the internal valve by back-motion of the plunger, and creating a seal between the cartridge and the housing by compressing the O-ring 112, a gaseous phase of the precursor can be released into the sealed volume and comes to normally-closed inlet port of the three-way valve 112. The temperature of the cartridge can be set to a desired value by action of a heater or thermoelectrical heat transfer device (for example, disposed on the cartridge body), creating desired pressure of the gaseous phase of the precursor material. A control signal can be supplied to a flow control device, such as the three-way valve 112, causing it to open and release the gaseous phase of the precursor material into the delivery line. The delivery line having fluid connection with the capillary at the tip of the nozzle via gas transfer tube transfers the gaseous phase of the precursor for release from the capillary into the sample chamber.

Figure 5A:
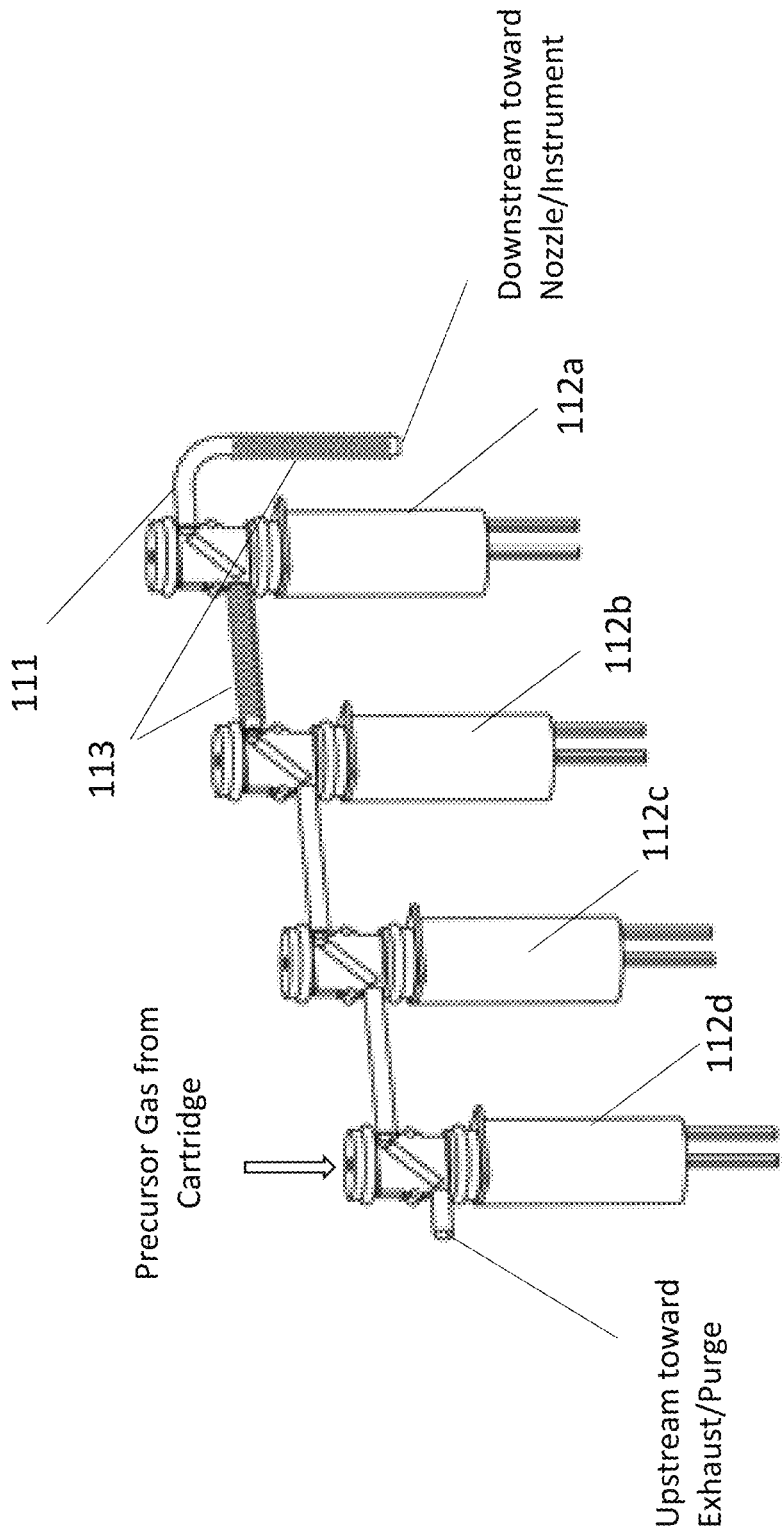
FIG. 5A illustrates an exemplary schematic of cartridge plumbing.

In reference to FIG. 5A, the configuration of the cartridge plumbing is described.

Multiple valves 112a, 112b, 112c, 112d can be provided to fluidly connect the precursor cartridges disposed in the cartridge housing ports 90a, 90b, 90c, and 90d with one or more delivery gas lines 111. The delivery line 111 fluidly connects the cartridge ports to the gas delivery line to deliver the precursor gas to the nozzle and then to the sample chamber, and also allows to exhaust or purge the precursor gas from within the line. By switching the series of valves 112a, 112b, 112c, 112d, the gaseous phase of precursor from the precursor cartridges can flow from any one of the cartridges into the delivery gas line 111 and downstream towards the nozzle. In some embodiments, the valves 112a, 112b, 112c, 112d are three-way valves. Because of the shared delivery line back-pumping and/or purging via the dedicated port on GIS body or one of the cartridge ports, actuation of three-way valve ensures that there is either (1) flow of a precursor gas downstream delivery path toward the nozzle with isolation from everything upstream or (2) fulldelivery line back-pumping and/or purging with dedicated purge gas. In some embodiments, the delivery gas line 111 is maintained at a temperature that prevents condensation of precursor in the gas line 111. In some embodiments, at least some sections of the gas line 111 include a thermally conductive sheath 113 surrounding the gas line 111 that can maintain the desired temperature. Additionally or alternatively, one or more other heating or insulating elements may be employed to maintain the desired temperature of the gas line 111.

Figure 5B:
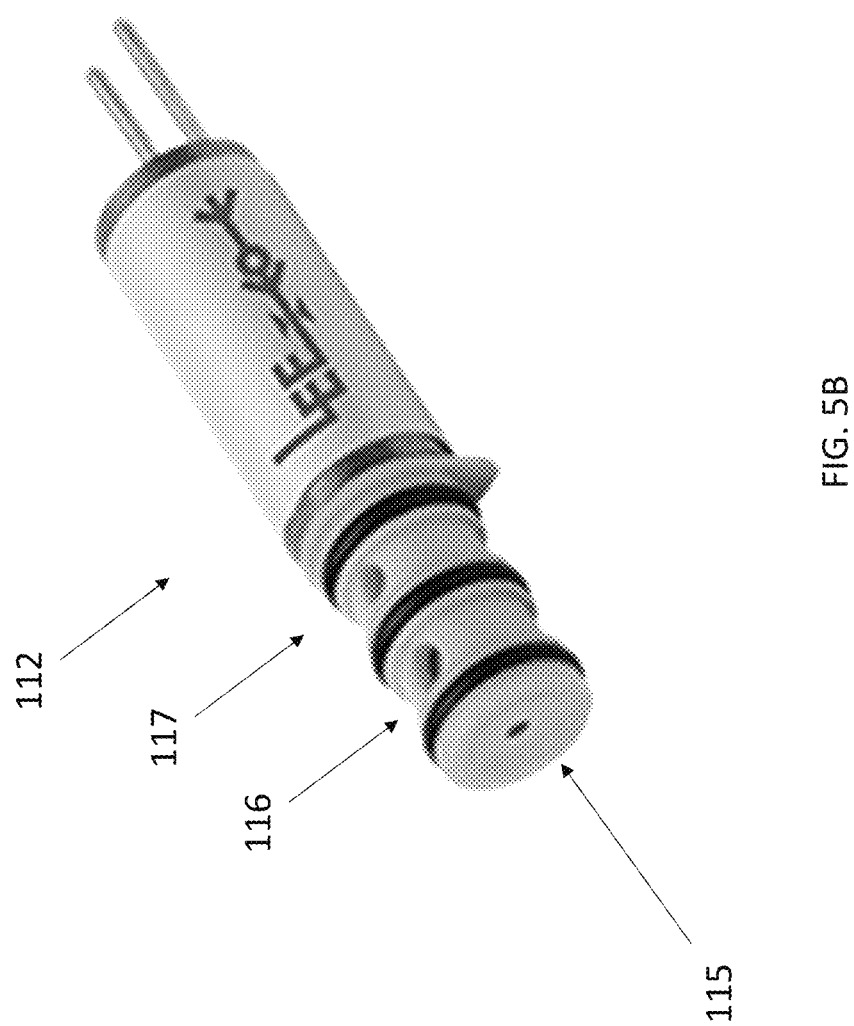
FIG. 5B illustrates an exemplary 3-way valve suitable for use with a GIS system of the present disclosure.

In reference to FIG. 5B, in some embodiments, a suitable 3-way valve 112 has 3 ports: a Normally-Closed (NC) port 115; a Switching port 116; and a Normally Open (NO) port. When the 3-way valve is not energized in its initial state, the NC port 115 is sealed and the NO port 117 is fluidically connected to the Switching port 116. When the valve is energized, the NO port 117 is sealed and the NC port is fluidically connected to the Switching port 116, allowing gaseous phase of the precursor flow downstream delivery path toward the injection capillary. When valve is de-energized, it returns to the initial state, where the NC port is sealed, and the switching port is fluidically connected to the NO port in upstream direction. Accordingly, in operation, the cartridges may be fluidically connected to the NC ports, the delivery line going downstream to deliver precursor into instrument may be connected to the Switching port, and the upstream delivery line to exhaust/purge may be connected to the NO port. In this manner, when the valve is not energized, the shared gas line 111 can be back-pumped, purged with compressed gas, or a gaseous precursor can be delivered to the instrument from outside the GIS body. In addition, the precursor cartridges can be connected to or isolated from the delivery line by controlling the state of their respective three-way valves for delivering a precursor gas to the instrument or for purging.

In reference to FIGS. 6A and 6B, in some embodiments, in order to clean the delivery line 111 when switching precursor materials or as a part of preventative maintenance, an additional port 120 is provided, for example, at the back cover 122 of the GIS body to be connected to an external gas source or an exhaust pump. Within the GIS body port 120 is fluidically connected to gas cartridge 123 which may be installed within one of cartridge housing ports. In some embodiments, gas cartridge 123 can be connected to evacuate or purge the lines by means of a last cartridge port. In that case pumping provided through the port 120 first evacuates the gas cartridge and the cartridge housing port. When the valve 112d opens, then vacuum within the gas cartridge becomes fluidically connected and evacuates gas line connecting the fourth to the third, the third to the second, and so on before pumping or purging entire gas delivery like downstream to the injection capillary. Alternatively, a gas can be supplied through the port 120 into the gas cartridge 123. When a corresponding valve 112 opens, the gas could purge the gas lines downstream from the cartridge port with gas cartridge 123 installed. These back pumping and molecular scrubbing (purging) cleaning approaches are rapid and robust. They save significant time and are far more effective compared to conventional means of cleaning with just heat and an open nozzle. In some embodiments, the port 120 may be used to introduce another gas precursor or a reactive gas to the system during the operation of the device.

When all valves 112a-112d are switched closed, back-pumping for the shared gas line 111 cable provided through the dedicated port 80 on GIS body that is fluidically connected to the Exhaust/Purge fitting on FIG. 5A. Compressed gas may be supplied through the same port to purge residual precursor from within the shared line 111 as part of clean-up cycle. Series connection of Normally-Open ports of the valves 112a-112d forms contiguous path in order to evacuate or purge-clean the shared line 111 when switching precursor materials or as a part of preventative maintenance.

It should be noted that, while the precursor material is typically a solid or liquid that can be vaporized, in some embodiments, gaseous substances, chemically-active or inert, may also be injected via gas cartridge and/or from outside the GIS housing. It should further be noted that, in some embodiments, the back-pumping or purging of the entire gas line may also be done via external port 80 that can be fluidically connected to the "Exhaust/Purge" fitting of the delivery line 111. Alternatively, the exhaust/pump port may be connected to the main chamber of the instrument maintained under vacuum pressure, or other evacuated volume. This pumping would work when all valves 112a, 112b, 112c, and 112d are closed. In some embodiments, back-purging of the entire gas delivery system, including tubing and gas lines, can be done by supplying inert, or chemically-inactive gas to Exhaust/Purge fitting when it is connected to the external pumping port 80.

Figure 7A:
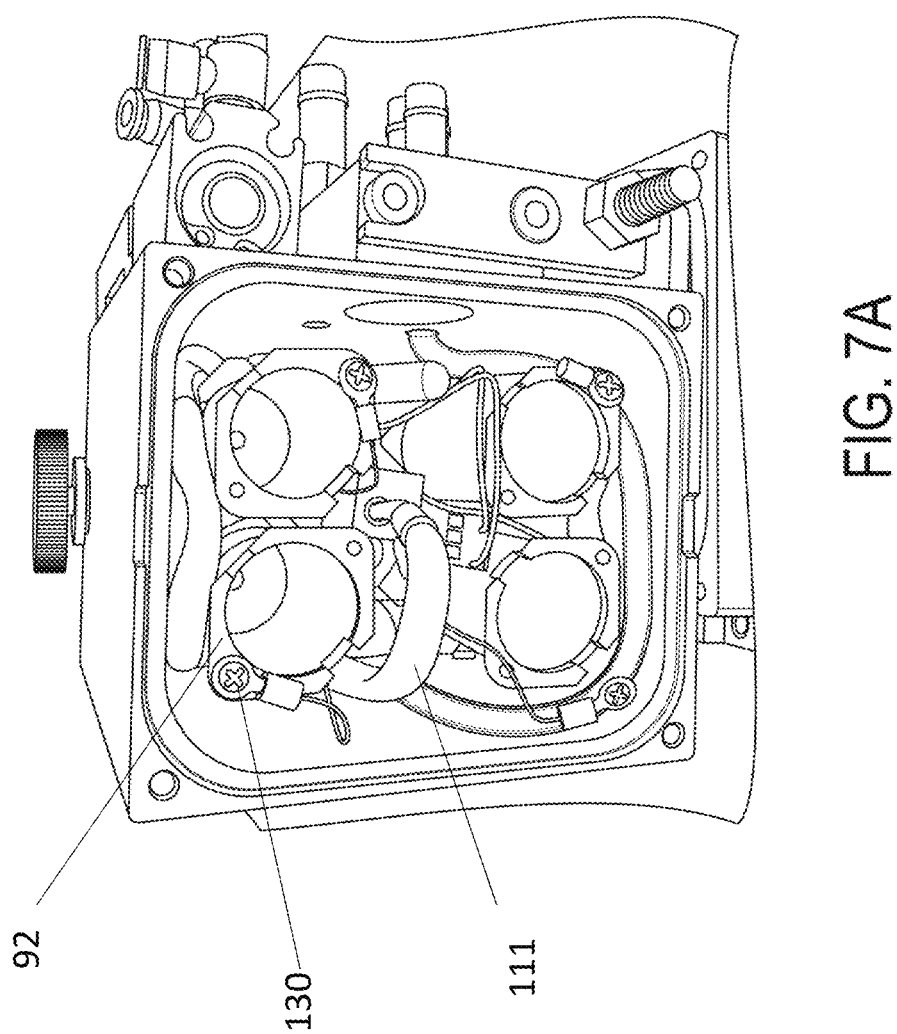
FIG. 7A illustrates an internal view of a GIS body of the present disclosure.

In some embodiments, the heating process by which pressure of gaseous phase of the precursor is controlled, is carried out by a temperature control device located at the valve of each cartridge port as shown in FIG. 3A. In some embodiments the temperature control device is resistive heater or thermoelectrical heat transfer element. In addition, the system is designed that the vaporized precursor does not condense in the gas line as it is being delivered to the sample chamber. The temperature is measured by a sensor 130, which can be mounted at the farthest point from the heater on each cartridge housing 92 (i.e. the top), as shown in FIG. 7A. By doing this, it is ensured that the entire precursor cartridge is heated to at least the measured temperature, which can be set above the sublimation point of the precursor to provide desired pressure of the gaseous phase. This coupled with the high vacuum within the GIS body, can help secure steady vaporization and prevent condensation at or near the valves or at the back of each cartridge. In addition to leveraging the high vacuum in the GIS body to remove convective heat transfer, the delivery line 111 connecting the cartridges can be made of a resistant plastic, wrapped with a thermally conductive shield to mitigate loss of heat from the delivery line via radiative heat transfer and reduce the risk of condensation in the line. Naturally, chemistries with the lowest vaporization temperature can be placed farthest upstream from the nozzle as they may have a longer pathway to the nozzle. In reference to FIG. 7B, a PCB 134 mounted on the platform supporting the cartridge housing can also be provided to minimize heat transfer. The through-board passageways can be oversized so heated components do not lose heat by conduction and the board is layered with a thermally non-conductive polymer, such as a PEEK polymer. Mechanical mounting of cartridge housings to may also be made through thermally insulative stand-offs with low thermal conductivity.

Figure 7B:
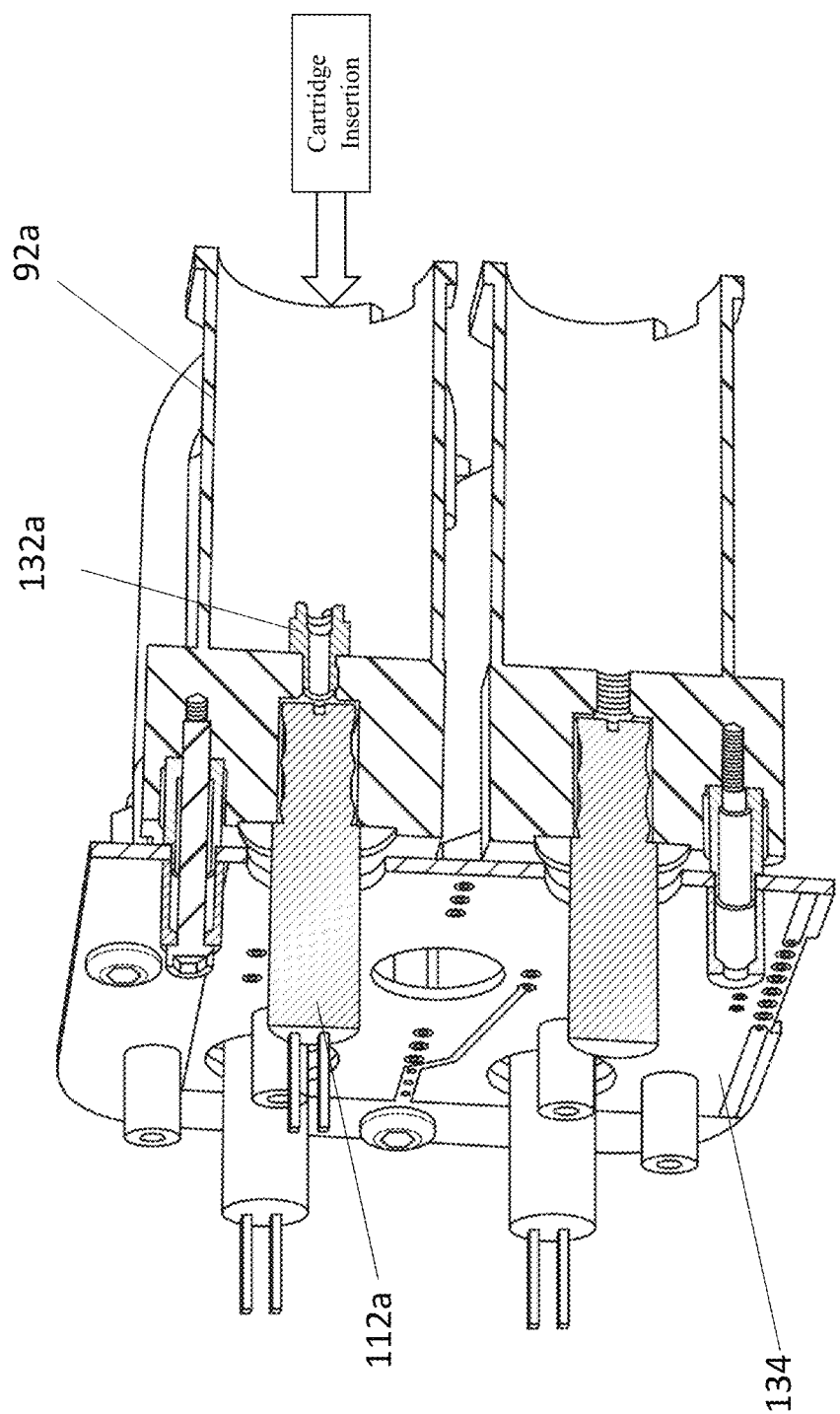
FIG. 7B illustrates mounting cartridge housings to PCB with oversized holes.

FIG. 7B further shows a cartridge valve actuator 132a disposed within the cartridge housing 92a and in communication with the three-way valve 112a. In operation, the cartridge valve actuator facilitates the fluid connection between the precursor reservoir of the cartridge and the three-way valve.

In reference to FIGS. 8A-8I, the components of the nozzle 20 are descried. As described above, the nozzle 20 connect to the GIS body to deliver precursor gasses to the instrument. In some embodiments, the nozzle 20 is designed to maintain a temperature necessary to prevent condensation of the vapors inside the nozzle. In some embodiments, the nozzle can comprise a set of metal tubes. In reference to FIG. 8A, an external tube 131 houses an internal gas line 130, which is connected to the delivery line 111 to deliver the precursor gas to the nozzle. In some embodiments, the internal gas delivery line 130 is a stainless-steel tube. One or more gas capillary tubes 136 can be provided at the end of the nozzle in communication with the gas line 130 to deliver the precursor gas to the sample chamber. In some embodiments, a single capillary can be used if the precursor gases can be mixed and delivered together, while multiple capillaries can be used if it is desirable to deliver the precursor gases separate. It should further be noted, that, as discussed, above multiple gas lines 130 may be employed.

In some embodiments, the temperature of the internal gas line can be maintained higher than the evaporation temperature of the gaseous phase of the precursor in the line so the vapor inside the gas line does not condense. If multiple delivery lines are used, each of the lines may be thermally controlled, but can be maintained at different temperature depending on the properties of the precursor gas delivered through each gas line. In some embodiments, the internal gas line 130 may be surrounded by a thermally conductive sheath 133 to maintain the temperature of the internal gas line 130. The space between the gas line 130/thermally conductive sheath 133 and external tube 131 can define a chamber that can be under vacuum to remove convective heat transfer from the gas line 130. In some embodiments, additional insulation or heating can be added around the internal gas line 130.

Figure 8A:
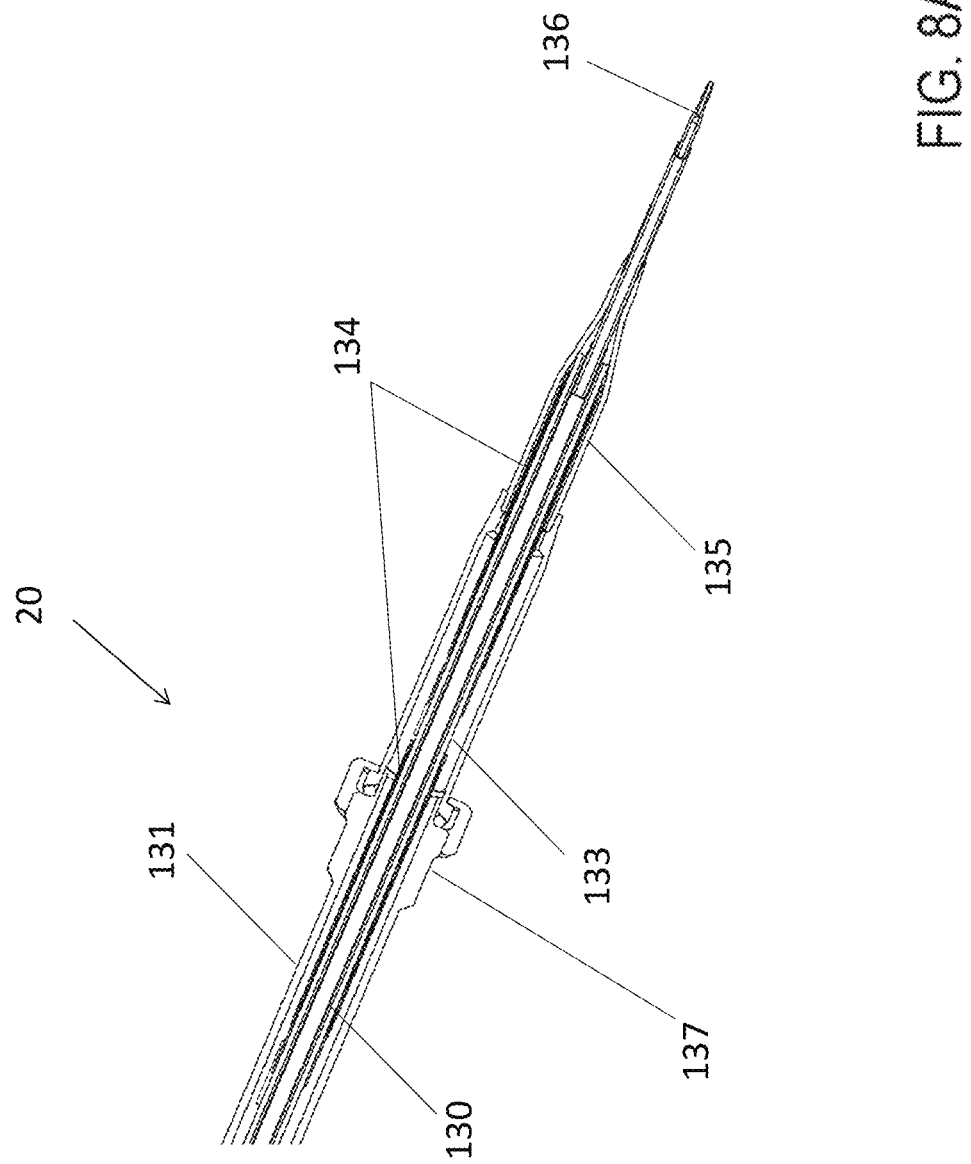
FIG. 8A and FIG. 8B illustrate an exemplary embodiment of nozzle components.
Figure 8B:
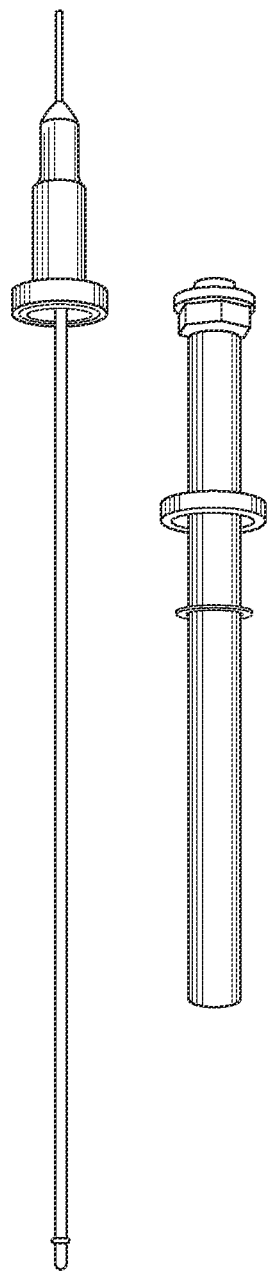

Toward the end of the nozzle, the thermally conductive sheath 133 transitions to an external heat spreader 135 below a coupling 137, as shown in FIG. 8B. In some embodiments, the external heat spreader can be made of a highly polished, gold-coated copper. Further, the nozzle end of the thermally conductive sheath can be outfitted with one or more heating elements 134. For example, a first heater 134 can reside near the upstream end of the outer tube, and could be made of thin-film resistive material. In some embodiments, the heating elements can be a heater, heat exchanger, thermally conductive sheath or heat spreader. Another heater 134 can be located downstream of the external tube. In some embodiments, the difference in heat dissipation by the nozzle heaters and the heaters used for the cartridge housings can result in a difference of temperature of a few degrees, with the area at the end of the conductive cap typically being the hottest on the whole injector. The slight temperature gradient, typically of about three to five degrees Celsius, facilitates emission of heat radiation starting from the end of the thermally conductive external heat spreader, leading to heating of the injection capillary and facilitating steady flow of gas phase without the risk of condensation at the exit of the nozzle. The high polish finish of the heat spreader cap can also minimize the radiative heat transfer to the chamber environment and sample.

Figure 8C:
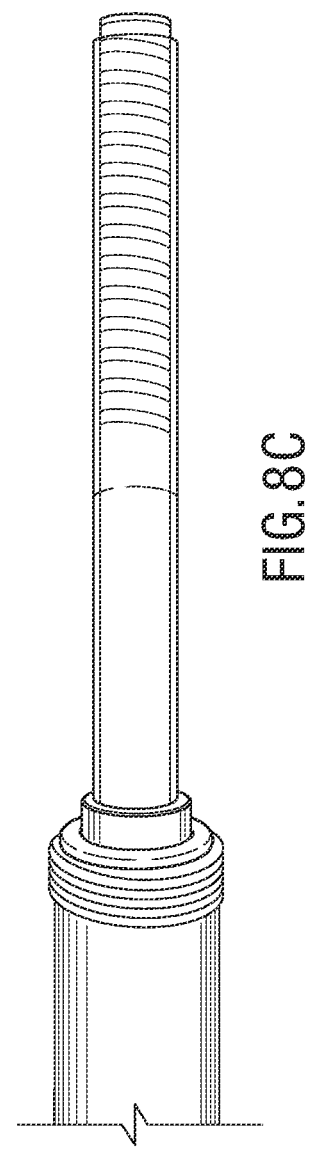
FIGS. 8C-8H illustrate non-limiting examples of thermal management elements of the nozzle.
Figure 8D:
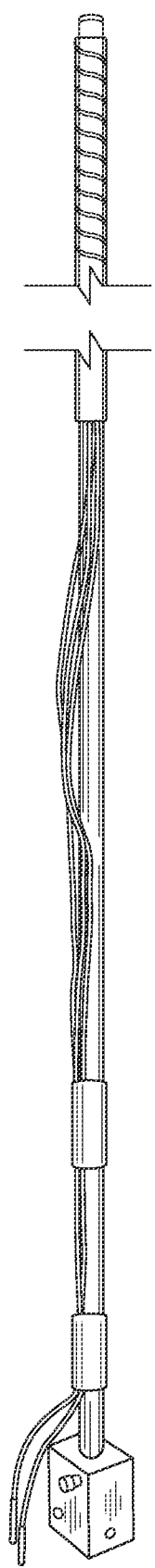
Figure 8E:
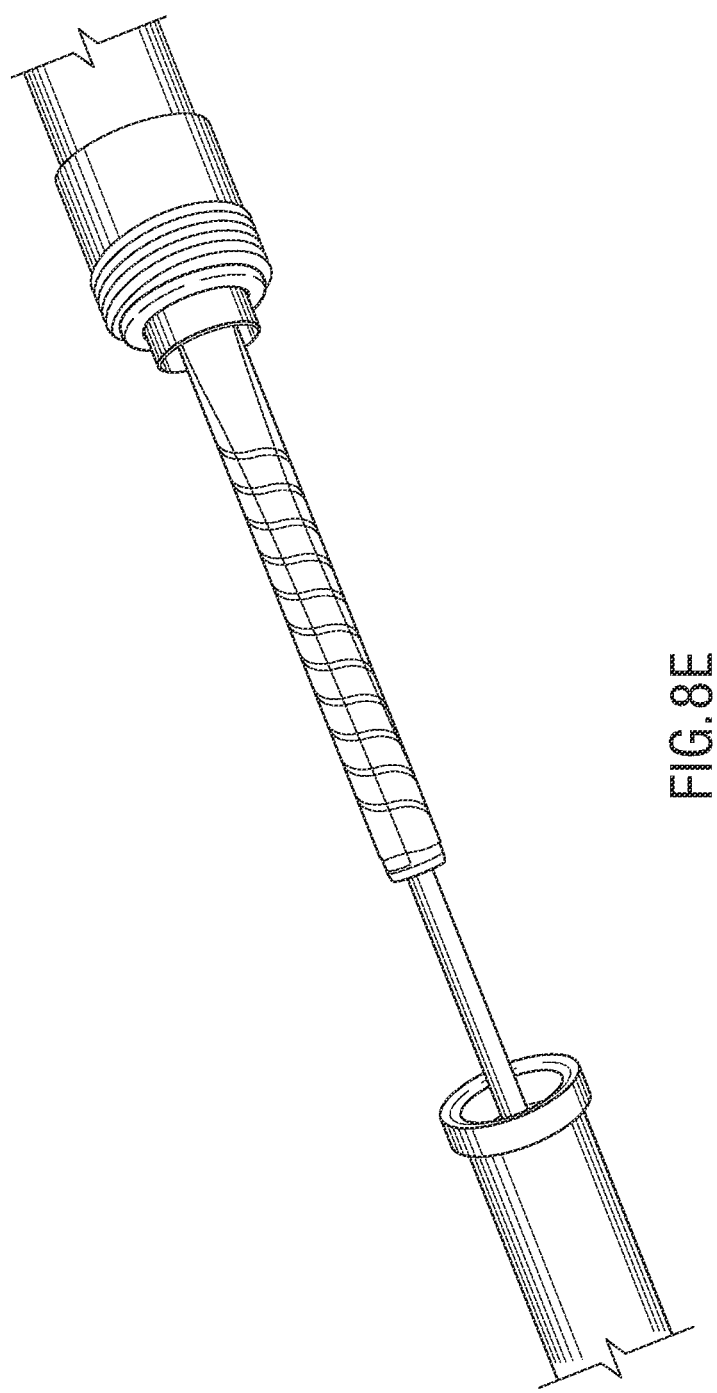
Figure 8F:
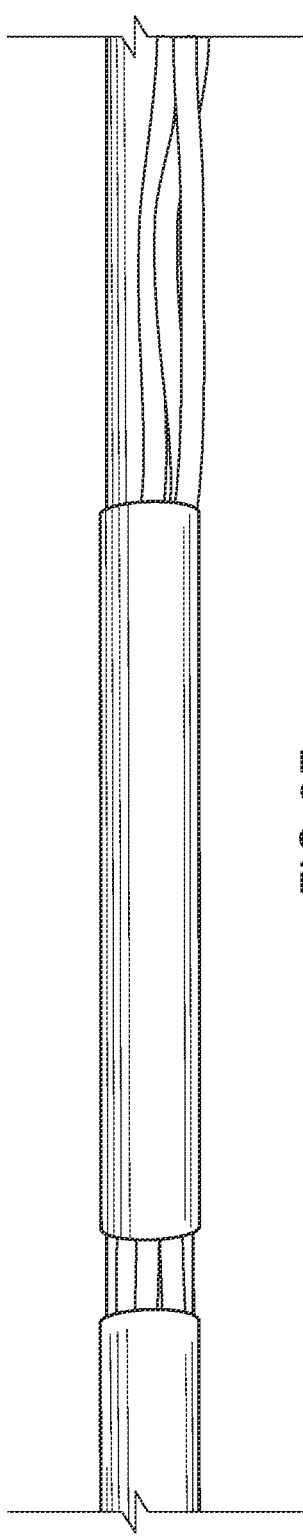
Figure 8G:
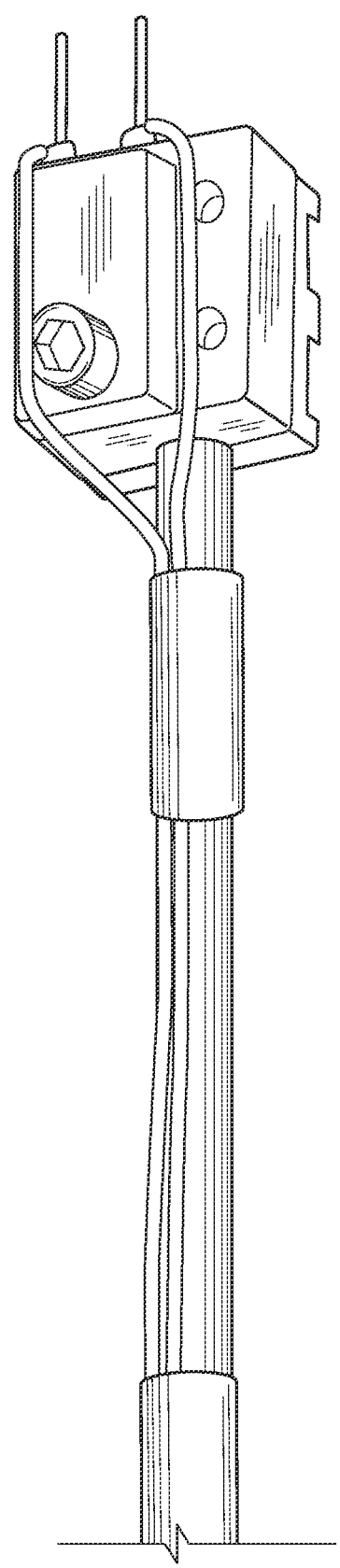
Figure 8H:
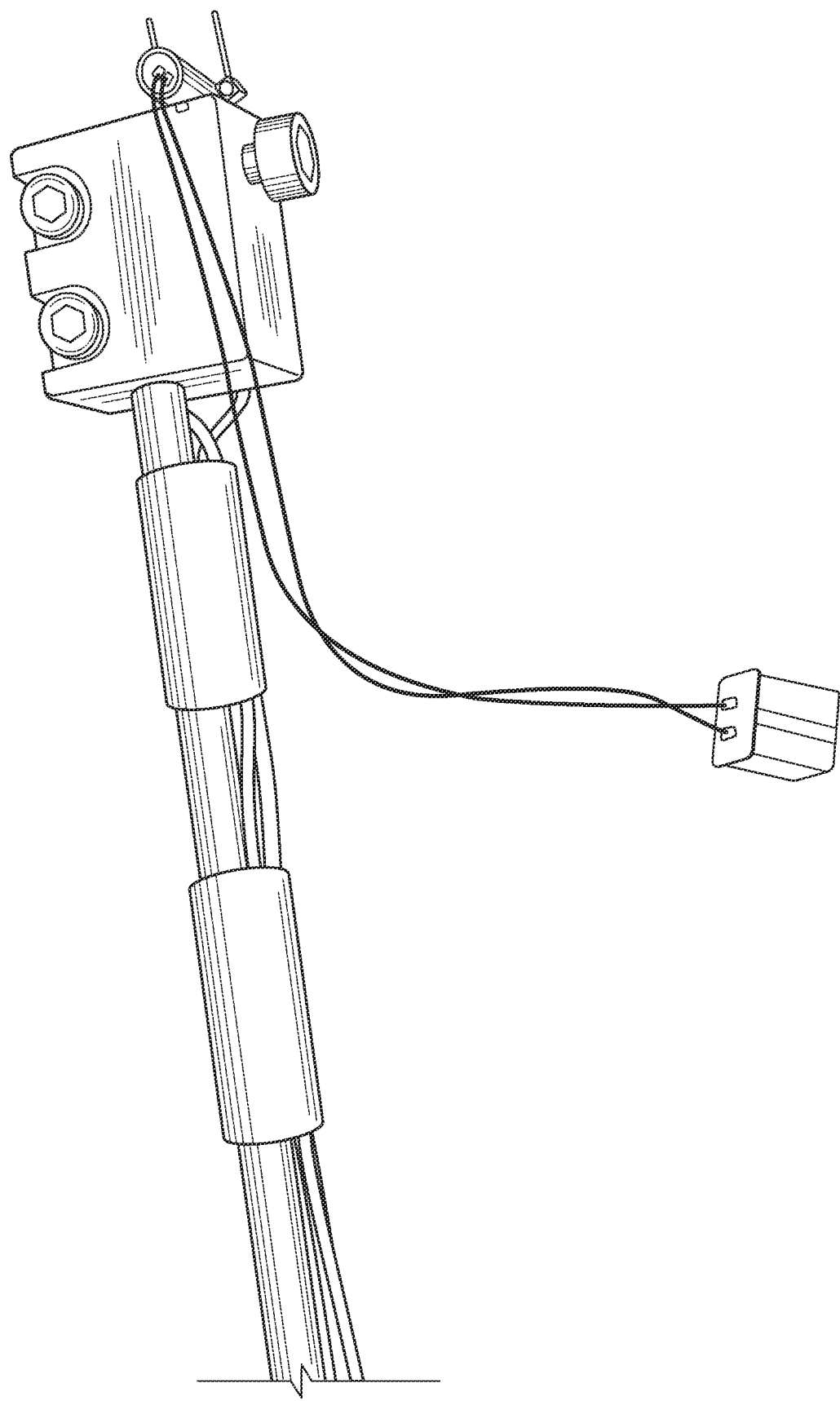

Further non-limiting examples of the thermal management elements of the nozzle are provided in FIGS. 8C-8E. FIG. 8C shows the tip of the of the thermally conductive sheath protruding from the lower coupling (the external heat spreader with the gas delivery line and the injection capillary are not shown). FIG. 8D shows the thermally conductive sheath/heat spreader. The temperature control elements or thermal control elements (for example, heaters 134) are wrapped around the gas line. FIG. 8E shows the gas delivery line with the sheath. Examples of a heater positioned on a thermally conductive sheath within a nozzle are shown in FIGS. 8F-8H. FIG. 8F shows heaters near the capillary end of the sheath. Black substance is a heat-shrink tubing covering the actual heaters are underneath. This end is inserted under external heat spreader. FIG. 8G shows the back-end of the sheath located at the top of gas delivery line, near the point of gas line connection. Back temperature control element (thin film resistor) is installed. FIG. 8H shows the back end of the sheath with a temperature sensor attached.

Figure 8I:
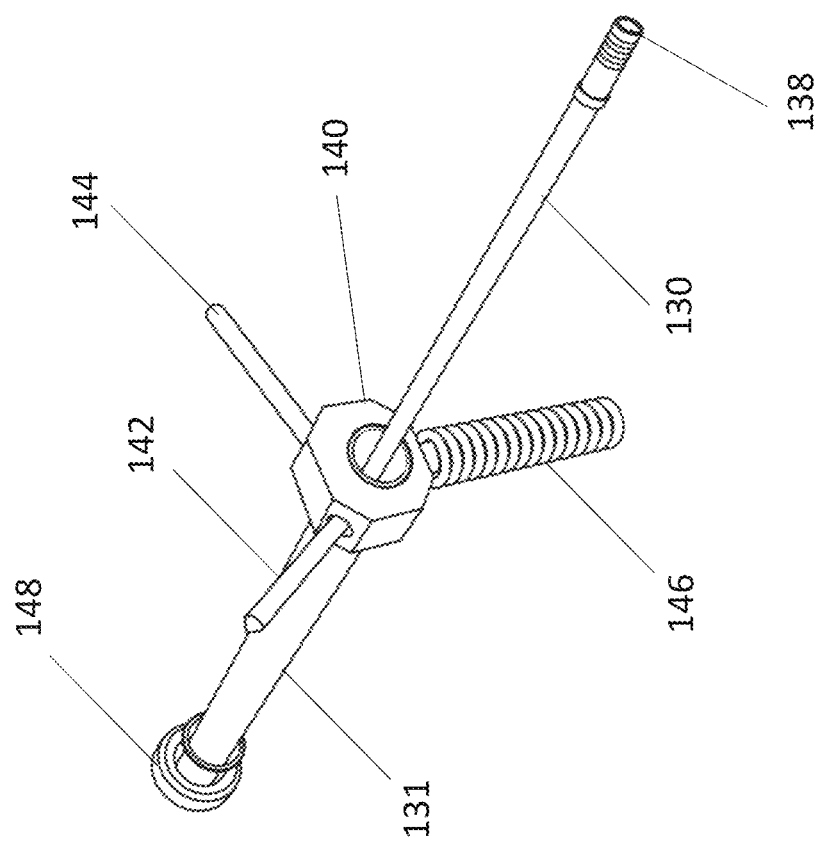
FIG. 8I illustrates an exemplary nozzle alignment system.

In reference to FIG. 8I, the nozzle can be provided with an alignment block 140 for adjusting the position of the nozzle within the sample chamber as discussed above. The alignment block can be located on the external tube 131, and the gas line 130 can pass through the alignment block 140. The gas line 130 can connect to the shared gas line at a gas line connection 138. The alignment blockrod 140 may include a set rod 142 for adjusting the x direction and a set rod 144 for adjusting the y direction of the nozzle. The alignment block can further include an alignment spring 146 that biases the internal tube 138 toward the center of the alignment block. The depth of extension can be fine-tuned by adjusting a corresponding set screw and the overall motion has a hard stop on the linear slide bearing. Control over nozzle position in the lateral directions is controlled by knobs 56 and 58 mounted on the housing. In some embodiments, the knobs drive rods into the alignment block 140 or stainless-steel internal gas tube to overcome resistance of the alignment spring 146, causing it shift. The rods 142, 144 interact with the internal tube at a point upstream before the O-ring connecting sections of stainless-steel internal gas tube. The force is applied far from the fulcrum point at the O-ring resulting in appreciable motion for small changes in knob position. All directional alignments have typical five-micron repeatability. FIG. 8C also illustrates an upper coupling 148 of the nozzle.

Figure 9:
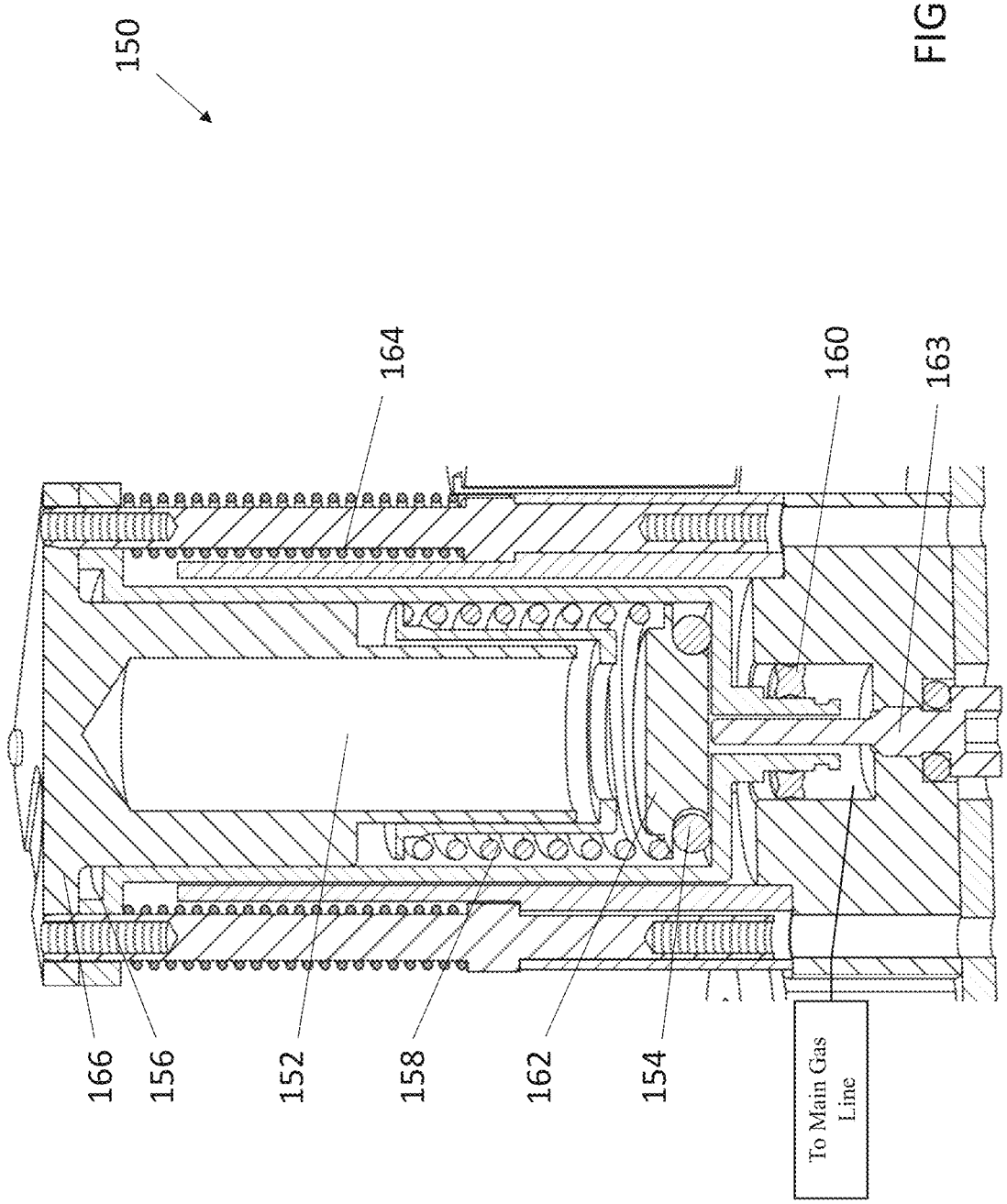
FIG. 9 illustrates a cross-sectional view of an exemplary cartridge suitable for use in a GIS system of the present disclosure.
Figure 10:
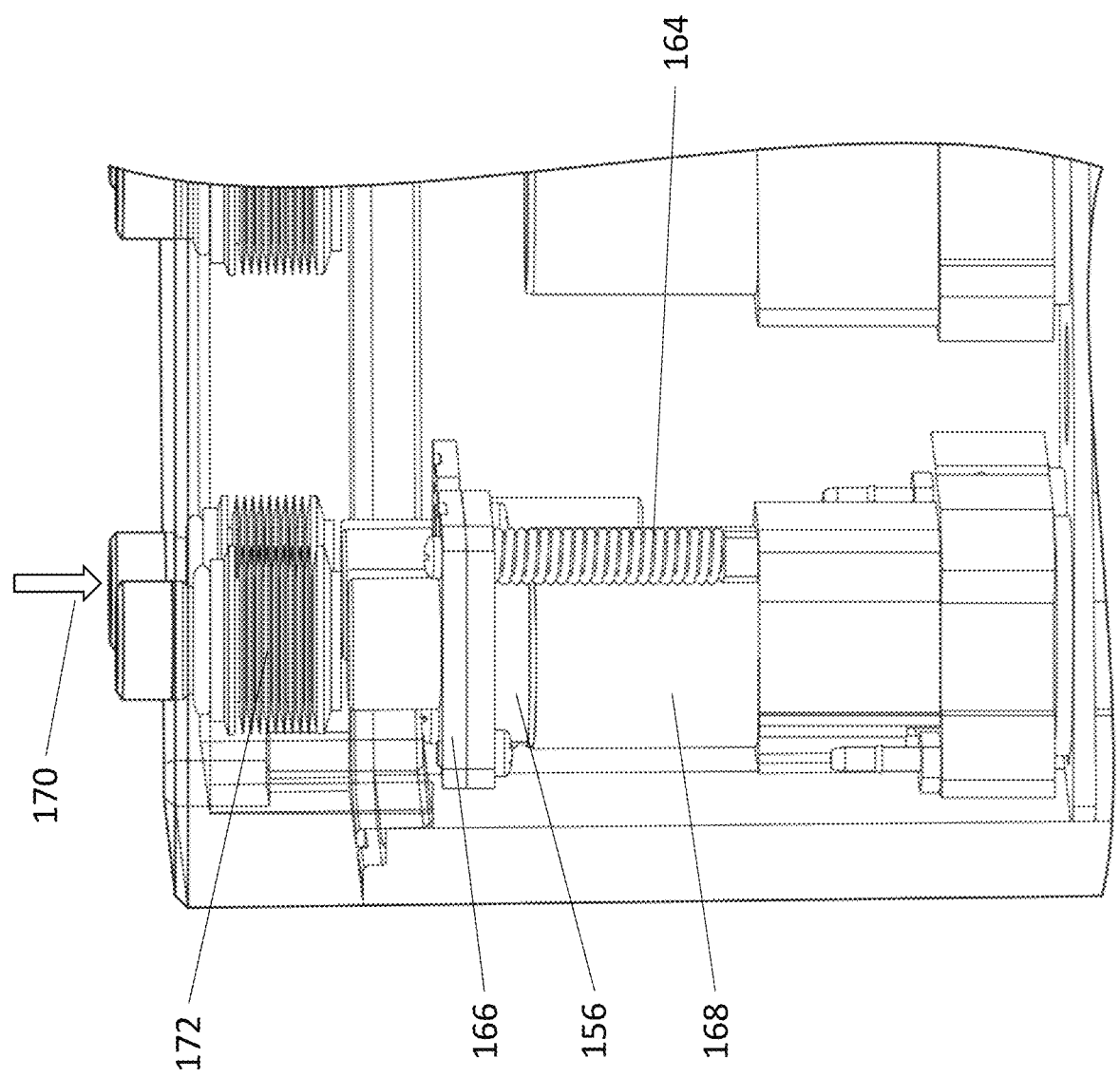
FIG. 10 illustrates a view of an exemplary pneumatic actuation for a cartridge suitable for use in a GIS system of the present disclosure.

FIGS. 9 and 10 illustrate another embodiment of a cartridge suitable for use in the GIS systems of the present disclosure. In some embodiments, such design can be associated with corrosive precursors, such as for example liquid bromine or solid iodine. In reference to FIG. 9, a cartridge for a corrosive precursor is shown in a cartridge housing. Such cartridge 150 can have a similar internal structure as the cartridge for non-corrosive precursors shown in FIG. 3B and FIGS. 4A-4B. As shown in FIG. 9, a liquid or solid precursor material can be placed into the internal volume of the precursor reservoir 152 and can be retained there by a gas-permeable membrane. The precursor can be sealed within the internal volume of the reservoir 152 of the cartridge by a plunger O-ring 154 pushed toward the cartridge body 156 by a compressed internal spring 158.

A front of a corrosive precursor cartridge can include a spout inserted in a receiving channel within the cartridge housing. A gas-tight sliding seal is formed between the spout and the channel in the cartridge housing, allowing motion of the cartridge along the channel. The seal can be created by an elastomer X-O-Ring 160 inserted into the channel within the cartridge housing and compressed between the spout and the channel within the cartridge seal.

In reference to FIG. 10, a corrosive cartridge 150 can be positioned within a cartridge housing 168 in such a way that its plunger 162 is touching a valve actuator pin 163. The cartridge body 156 is kept from pushing on the valve actuator pin by force of a one or more compressed cartridge retraction springs 164 and the internal spring of the cartridge. As shown in FIG. 10, a release of the precursor from within the cartridge 150 is achieved by action of compressed air injected through a compressed air inlet 170 into an expansion bellows 172. Internal pressure build-up within the bellows would cause the bellows expansion in the axial direction of the cartridge. The expanding bellows can apply force to a cartridge base 166, overcoming resistance of the cartridge retraction springs and internal spring of the cartridge, and causing the entire cartridge to move further into the cartridge housing 168 in an axial direction. This axial motion can cause the valve actuator pin to cause the plunger to move away from the base of the cartridge body. This motion can result in release of pressure from the plunger O-ring and the opening of a fluid connection between the internal volume of the cartridge and the cartridge housing, releasing precursor flow from the cartridge into the cartridge housing and further into the gas delivery line.

Figure 11:
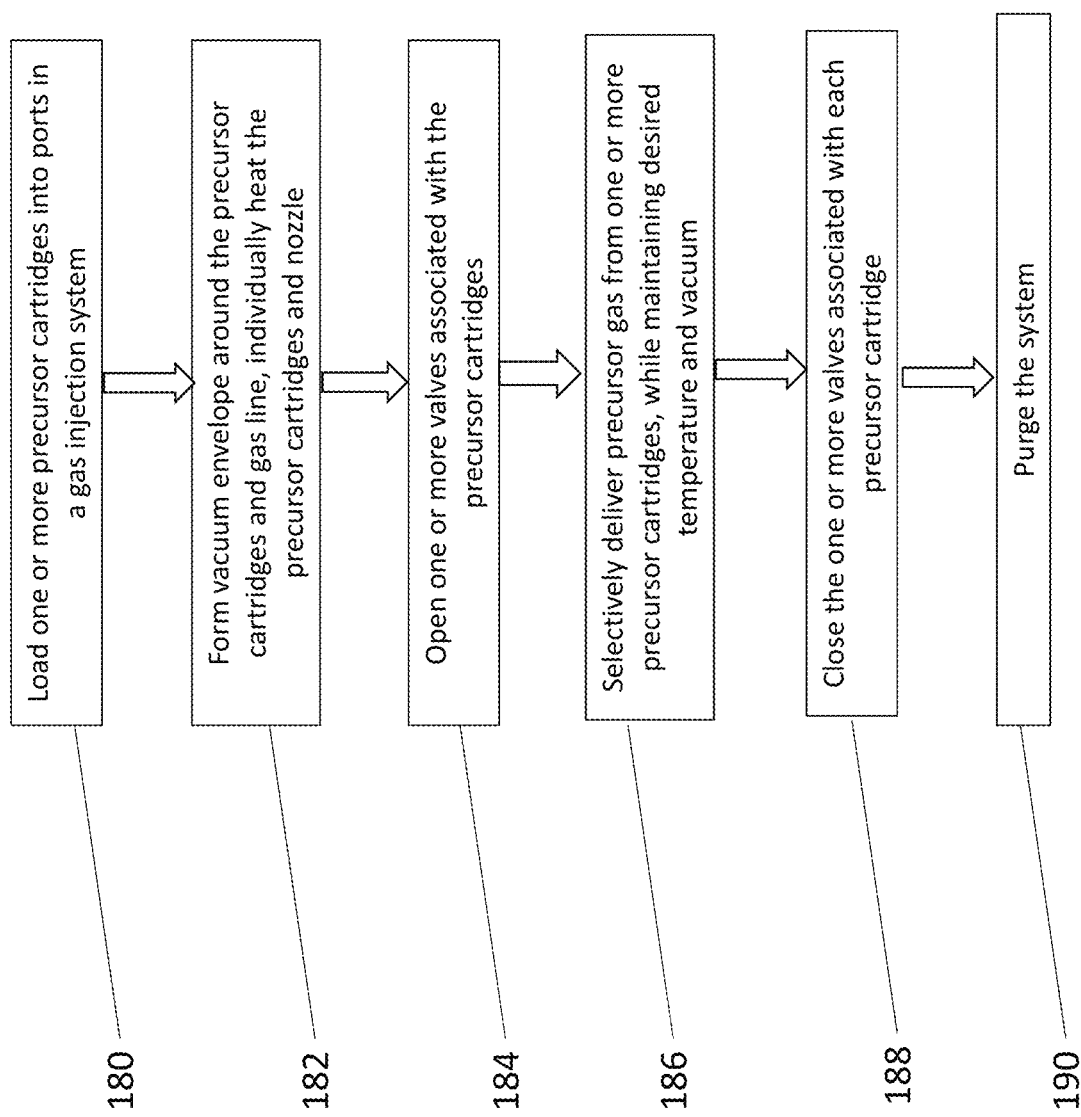
FIG. 11 is an exemplary flowchart of the disclosed process.

In reference to FIG. 11, an exemplary process flow chart is presented. In step 180, one or more precursor cartridges are loaded into the gas injection system. The precursor cartridges are inserted into the cartridge housings of the GIS body. In step 182, a vacuum is formed in the GIS body to create a vacuum envelope around the cartridges. Next, the cartridges can be individually heated to vaporize the precursor material. In addition, the system is heated to prevent condensation of the precursor gas in the system. In step 184, selected one or more valves is open to allow the flow of the precursor gas from the selected cartridges into the delivery line and into the nozzle and on into the sample chamber. In step 186, a precursor gas or a mixture of precursor gasses can be selectively delivered to the sample chamber by connecting or disconnected various cartridges from the delivery line. As the precursor gas is delivered to the sample chamber, the vacuum and temperature are maintained in the system. As described above, if necessary, the precursor cartridges can be switched by breaking the vacuum in the GIS body, but not in the instrument. In step 188, the flow of the precursor gas is shut off and the system can be purged in step 190.

The present disclosure includes various embodiments of the above-described methods, systems and components as follows: In some embodiments, a multi-precursor gas injector mounted on the port of FIB, SEM, or another instrument, internal volume of which is evacuated, either through dedicated evacuation port or through evacuation opening(s) directly into the chamber of the instrument, thus forming vacuum envelope surrounding all internal elements of the gas injector. In some embodiments, cartridges with chemical precursor are fully enclosed within the vacuum envelope. In some embodiments, vacuum envelope surrounding cartridges with the precursors provides secondary containment for chemicals enclosed within the cartridge. In some embodiments, vacuum envelope surrounding cartridges with the precursors serves as thermal barrier, preventing heat transfer between cartridges and between each of the cartridges and other elements of the injector. In some embodiments, cartridges with chemical precursors containing integrated valve remaining normally-closed during transportation and installation of the cartridge. Said valve may be opened when cartridge is installed within the gas injector. In some embodiments, upon installation of the cartridge, the integrated valve could be maintained in opened position and flow of the precursor from cartridge is controlled by additional cut-off valve in the cartridge housing or elsewhere. In some embodiments, the integrated valve within the cartridge is used to control flow of the precursor from cartridge by mechanically actuating position of cartridge within the housing. In some embodiments, the valve integrated within the cartridge is used to control flow of the precursor from the cartridge by mechanically actuating the valve, while cartridge remains in fixed position housing. In some embodiments, actuation of the valve position could be pneumatic, electromagnetic, electro-mechanical, piezo, or other means. In some embodiments, temperature of cartridges, their housings, elements of flow path, and other elements of injector is maintained above, at, or below ambient as needed for controlling pressure of the precursor(s) delivered from cartridges and preventing condensation of precursors on elements of the delivery system. In some embodiments, above-ambient temperature may be maintained by a heater in close mechanical and thermal contact with cartridge or its housing. In some embodiments, above, at, and below ambient temperature may be maintained by a heat transfer device, such as Peltier element, heat exchanger, or other thermal or temperature control/transfer element in close mechanical and thermal contact with cartridge or its housing. In some embodiments, excess heat generated by active heat transfer devices is removed either by close mechanical and thermal contact with external enclosure of the envelope, convection cooling, or by heat exchanger with refrigerant flowing through it. In some embodiments, inserts within the channels of heat exchanger may be added to force refrigerant flow along the walls of the channels and mixing of the refrigerant during the flow to improve efficiency of heat transfer within the heat exchanger. In some embodiments, temperature below ambient may be maintained by heat removal device in close mechanical and thermal contact with the cartridge or its housing, for example by a heat exchanger with refrigerant flowing through it. In some embodiments, thermal feedback loop(s) independently controlling temperature of all, or each one of multiple cartridges with chemical precursor(s) inside of the same vacuum envelope. In some embodiments, pressure of the precursor in cartridges is regulated by controlling temperature of the cartridge and its corresponding housing. In some embodiments, chemical precursors transported between cartridges and to the injection capillary by tubing resistant to the attack by the precursors. In some embodiments, tubing transporting chemicals is enclosed in thermal sheath with conditions suitable for flowing precursors without condensation, decomposition, or other adverse effects on transported material. In some embodiments, the sheath could be rigid, for example made from aluminum, copper, or other metal with suitable thermal conductivity. In some embodiments, the sheath could be flexible or semi-flexible, for example made of copper or aluminum foil, coil braid, mesh, thermally-conductive rubber with or without metal core, or flexible composite material. In some embodiments, temperature and thermal gradient on the sheath may be defined by thermal conductance of the sheath material physically connected to thermally controlled cartridge or the housing. In some embodiments, temperature and thermal gradient of the sheath may be controlled by independent heater(s) installed on the sheath, either along the length of the sheath or at specific locations as required for creating thermal gradient. Heaters of the sheath may operate at fixed pre-determined temperature, or feedback loop may be employed to control temperature of the sheath. In some embodiments, temperature and thermal gradient of the sheath may be created and controlled by passing electrical current through the sheath. In some embodiments, compatible chemical precursors from different cartridges delivered into the instrument through singular injection capillary. In some embodiments, connection of compatible chemical precursors to singular injection capillary within the vacuum envelope is serial with three-way injection valves on each precursor housing, or through parallel manifold. In some embodiments, in manifold connection precursor housings may have two-way ON-OFF valves interrupting flow of the precursors. In some embodiments, in manifold connection each precursor flow may interrupted by a three-way valve. In some embodiments, when flow of the precursor gas is interrupted purge gas may be injected into the manifold or gas injection capillary to remove residual precursor. In some embodiments, valves in manifold and serial connection could be operated sequentially, thus injecting multiple precursors or their mixture through the capillary. In some embodiments, more than one capillary running in parallel may be employed for simultaneous injection of precursors which can't be intermixed. In some embodiments, injection capillaries may release precursor(s) directly into the chamber of the instrument, or have a gas concentrator creating virtual processing chamber near the surface of the sample. In some embodiments, chemical precursors injected into the instrument through the delivery capillary may interact with sample material maintained above, at, or below ambient temperature. In some embodiments, temperature of sample above the ambient may be maintained by resistive heater or a heat transfer device, Heat transfer device may be either passive such as a heat exchanger, or active such as Peltier or similar element. In some embodiments, excess heat is removed from the sample, or the Peltier or other active heat transfer element controlling temperature of the sample, by flowing heat transfer fluid or other media through internal channels of the heat exchanger in close mechanical and thermal contact with the sample or the heat transfer element. In some embodiments, channels of heat exchanger may contain inserts forcing refrigerant flow along the walls of the channel and intermixing of the refrigerant during the flow.

The following description and procedure are presented as non-limiting examples of the methods, systems and devices of the present disclosure.

Examples, which are set forth to aid in the understanding of the disclosure, should not be construed to limit in any way the scope of the disclosure as defined in the claims which follow thereafter. The following examples are put forth so as to provide those of ordinary skill in the art with a complete disclosure and description of how to make and use the embodiments of the present disclosure, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations should be accounted for.

Examples: Description of Controller States

Figure 12:
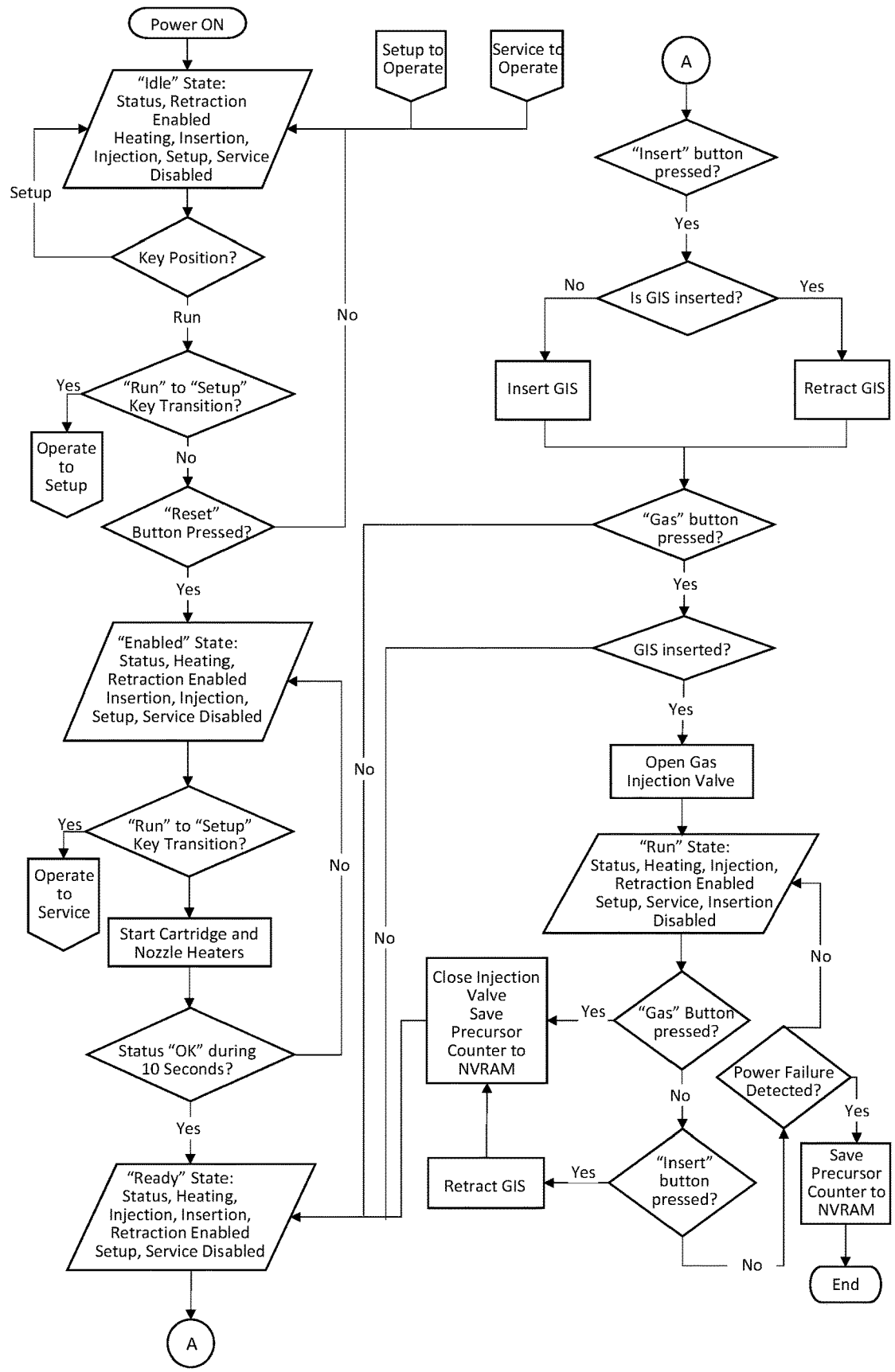
FIG. 12 is an exemplary flowchart that represents controller states and logic flow in ready and run states.
Figure 13:
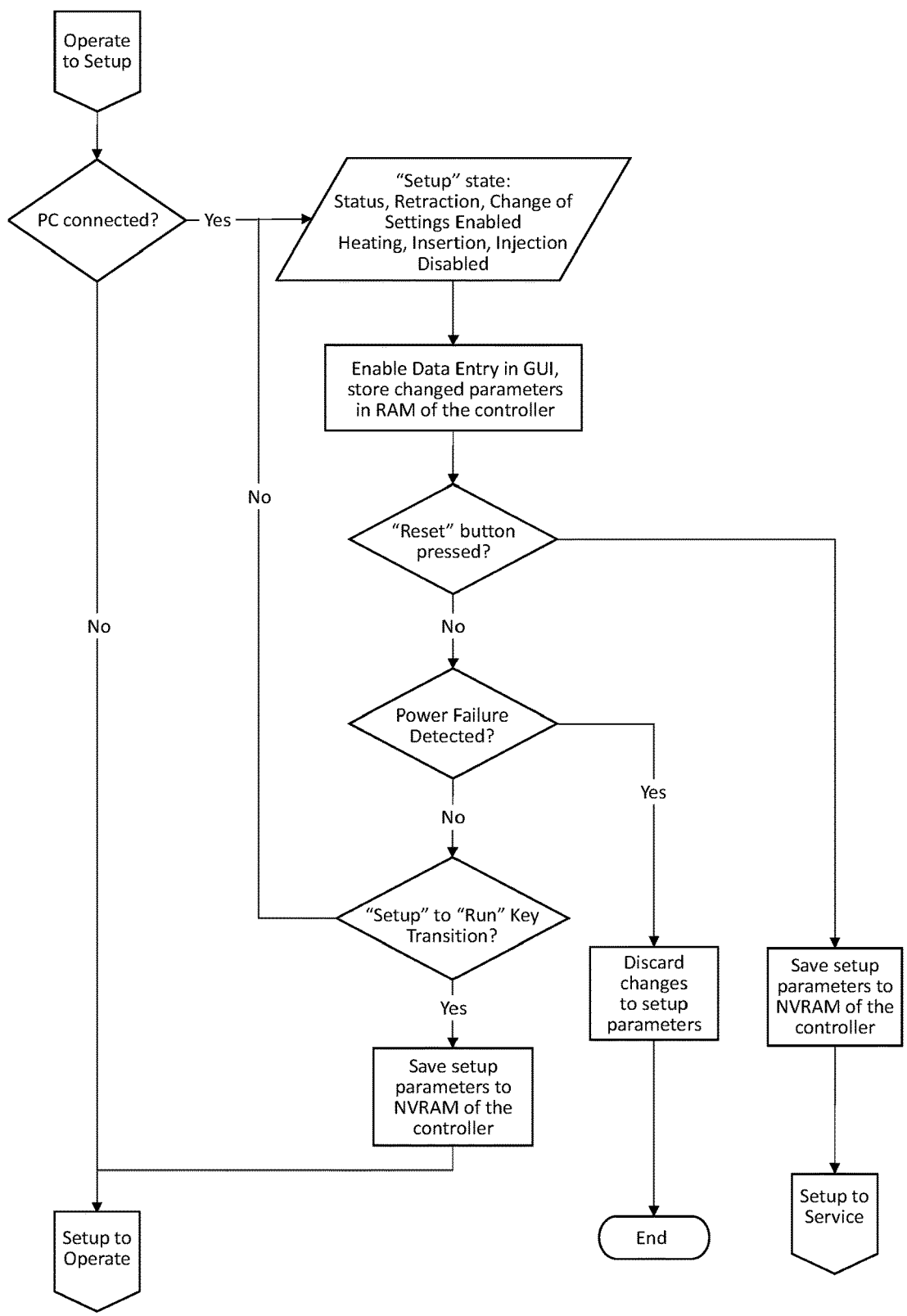
FIG. 13 is an exemplary flowchart that represents controller logic in setup.
Figure 14:
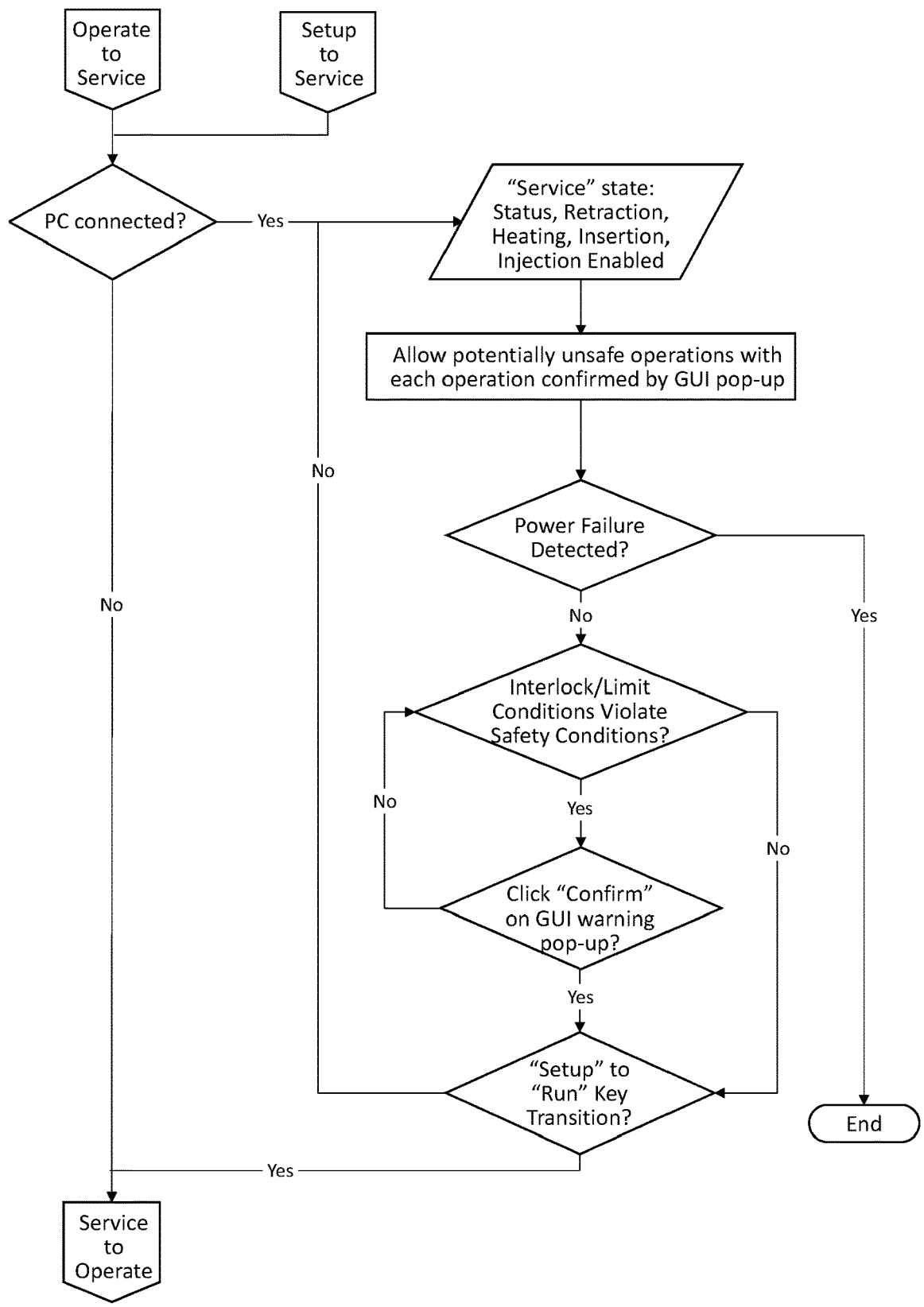
FIG. 14 is an exemplary flowchart that represents controller logic in service state.
Figure 15:
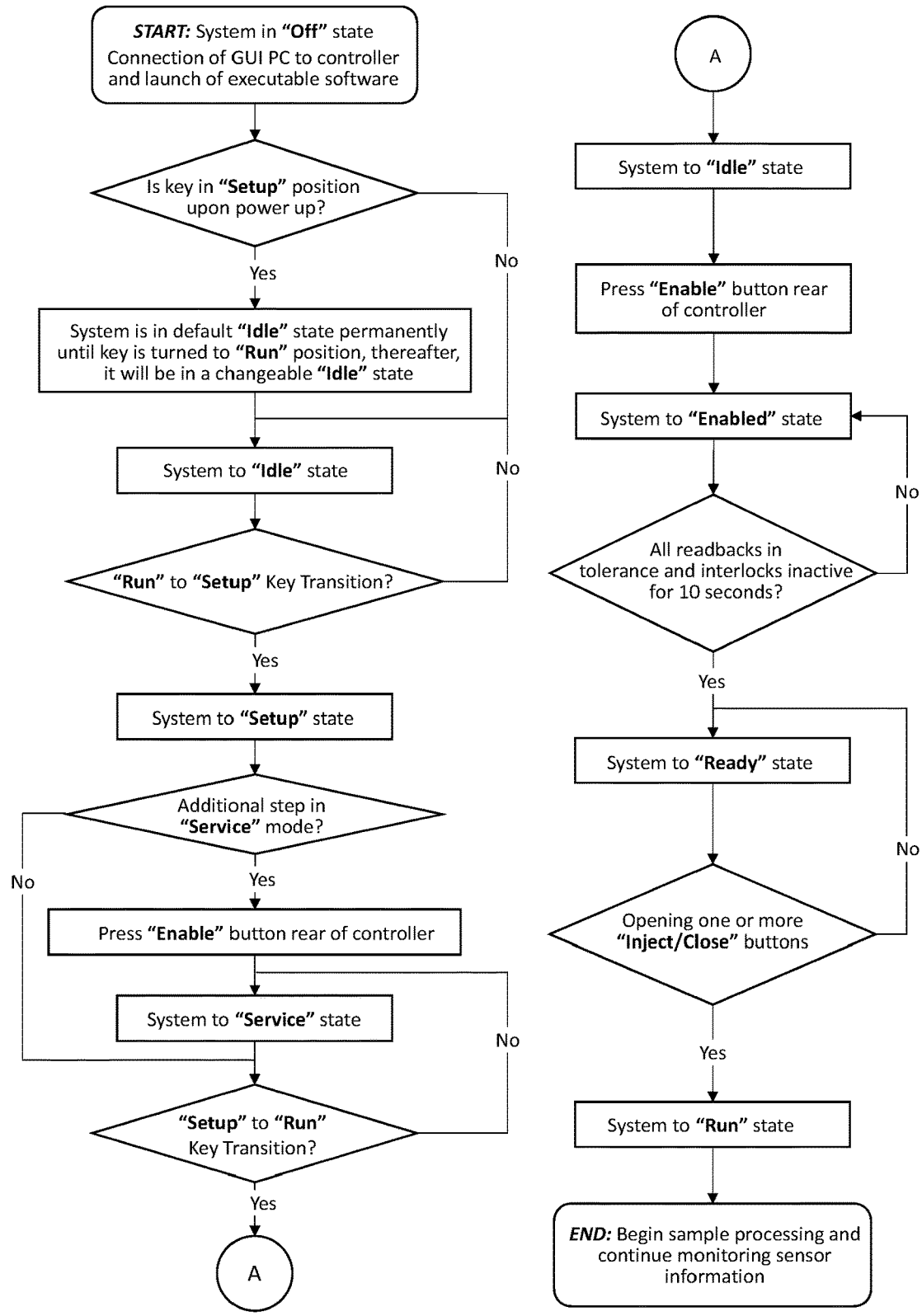
FIG. 15 is an exemplary flowchart that represents user operation logic flow diagram.

FIGS. 12-15 present non-limiting embodiments of flowcharts of the system states. FIG. 12 represents controller states and logic flow in Ready and Run states. FIG. 13 represents controller logic in Setup. FIG. 14 represents controller logic in Service state. FIG. 15 represents user operation logic flow diagram.

As shown in the exemplary state flowchart of FIG. 15, at startup, the system is in an "Off" state, and there is connection of GUI PC to a controller and a launch of executable software. If the key is in "Setup" position on power up of the system, then the system is in default "Idle" state permanently until key is turned to "Run" position. Then, the system can be in a changeable "Idle" state. Once the system is in "Setup" mode, if the system moves to "Service" mode, an "Enable" state button can be pressed at a rear portion of the controller. In the next step, the system can be in "Service" state. If the key is transitioned from "Setup" to "Run" state, the system moves to the "Idle" state. The "Enable" button can be pressed to move the system into the "Enabled" state. If all the readbacks in tolerance and interlocks inactive for 10 seconds, then the system moves into a "Ready" state. If one or more "Inject/Close" buttons are open, then the system moves into a "Run" state such that sample processing can begin.

There are various system changes that effect the system state.

1. Upload of executable software should reset controller and take it into "Idle" state.

2. Connection and disconnection of GUI PC to controller should not cause reset of the controller and should not affect its operation in any way.

3. "OFF" state—power is removed, all injection valves are closed, GIS insertion air supply valve is closed and the GIS is retracted. From "OFF" state controller can only switch into "Idle" state. "OFF" state is entered from any other state by removing power from the controller.

4. "Idle" state is entered upon power-up regardless of positions of any buttons, keys, or switches. In "Idle" state all injection valves are closed, GIS is retracted, heaters and Petltiers are disabled, readbacks are "Enabled," GUI screen (if connected) is in read-only mode, and all buttons except "Setup/Run" key on the front panel and "Enable" button on the back of the controller are disabled. From "Idle" state controller can switch into "OFF," "Enabled," and "Setup" states.

5. "Setup" state is entered from "Idle" state by turning "Setup/Run" key into "Setup" position. If the key was in "Setup" position upon power-up then the controller must permanently remain in "Idle" state until "Setup/Run" key is turned into "Run" position. If "Setup/Run" key was in "Setup" position upon entering the "Idle" state, then the key must be turned into "Run" and back into "Setup" position to enter the "Setup" state. In "Setup" state GUI functionality is available in read/write mode, and setup parameters can be changed. All changes are saved into non-volatile (FLASH, EPROM, etc. . . . ) of the controller and text/configuration file on the GUI PC. All front-panel buttons (with exception of "Setup/Run" key), valves, heaters, Peltiers, and insertion functionality remains disabled. From "Setup" state controller can enter "Off" "Idle," and "Service" states.

6. "Idle" state is entered from "Setup" state if "Setup/Run" key is turned into "Run" position.

7. "Service" state is entered from "Setup" by pressing "Enable" button on the rear panel of the controller. If "Enable" button was already pressed while entering into "Service" state, then it must be released and pressed again in order to enter "Service" state from the "Setup" state. At the entrance into "Service" state controller must read all the current setup information stored in non-volatile memory (FLASH, EPROM, etc. . . . ) of the controller. In "Service" state insertion functionality is enabled, power is applied to heaters and Peltiers, and temperature feedback control becomes enabled. All GUI and front-panel control buttons are functional in "Service" state. From "Service" state controller can enter "OFF" and "Idle" states.

8. In "Service" state interlock and limit conditions are monitored and if operation would violate the safety conditions then (a) GUI pop-up message should appear stating: "Operation violates at least one of" the safety limits and could be dangerous. Press "Confirm" to continue with operation in "Service" state or "Cancel" to return, and (b) corresponding button on the controller should start flashing with 2 Hz frequency. Pressing "Confirm" on the 9. "Idle" state is entered from "Service" state by turning "Setup/Run" key into "Run" position.

10. "Enabled" state is entered from "Idle" state by pressing "Enable" button on the rear panel of the controller. If "Enable" button on the rear panel was pressed during power-up then it must be released and pressed again in order to enter "Enabled" state from the "Idle" state. At the entrance into "Enabled" state controller must read all the current setup information stored in non-volatile memory (FLASH, EPROM, etc. . . . ) of the controller.

11. In "Enabled" state power is applied, and heaters/Peltiers, temperature and pressure readbacks are monitored, and interlock conditions are checked. As long as any of the enabled readbacks are out of tolerance or any of the enabled interlock conditions are not met, the controller shall remain in "Enabled" state. In "Enabled" state injection valve buttons on GUI and injection buttons on front panel of the controller are disabled. Only retraction operation of the GIS is allowed in "Enabled" state. If GIS was extended at the time of controller entering "Enabled" state then it should remain in extended position. Retraction of GIS is possible by pressing corresponding button on GUI or on front panel of the controller, but extension is disabled. From "Enabled" state controller can enter into "OFF," "Service," "Idle" and "Ready" states.

12. "Enabled" state is entered from "Ready" or "Run" states when at least one of the enabled readbacks gets out of tolerance or at least one of the enabled interlocks becomes Active. If controller enters "Enabled" state from "Run" or "Ready" states then GIS position doesn't change. If controller enters "Enabled" state from "Ready" or "Run" state, then all injection valves should close and error message corresponding to the reason of entering "Enabled" state must be displayed.

13. "Service" state is entered from "Enabled" state by turning "Setup/Run" key into "Setup" position.

14. "Ready" state is entered from "Enabled" state when all readbacks get into tolerance and interlocks are inactive for at least 10 seconds.

15. "Service" state is entered from "Ready" state by turning "Setup/Run" key into "Setup" position.

16. "Run" state is entered from "Ready" state by pushing one or more "Inject/Close" buttons on GUI or on the front panel of the controller and opening corresponding injection valve(s). From "Run" state controller can enter "OFF," "Service," "Ready," and "Enabled" states.

17. "Service" state is entered from "Run" state by turning "Setup/Run" key into "Setup" position. If any of injection valves were open while entering "Service" state from "Run" state then such valve(s) should remain open. If GIS was extended while entering "Service" state from "Run" state then GIS should remain extended.

18. "Ready" state is entered from "Run" state by pressing injection button on GUI or front-panel of the controller and closing all the injection valves.

19. "Idle" state is entered from "Enabled," "Ready," or "Run" states when one of the hardware limits of temperature or pressure readbacks is exceeded, or when abnormal hardware condition is detected.

Controller and GUI Behavior in "Idle" and "Enabled" States

Below are various examples of changes in state related to "Idle" and "Enabled" states.

1. When controller is powered up it enters "Idle" state: controller is powered, all injection valves are closed, GIS is retracted, the heaters/Peltiers are disabled, and readbacks and interlock indicators are "Enabled."

2. While the controller is in "Idle" state with Setup/Run key in "Run" position and GUI application is up and connected, the GUI screen is read-only: temperature, pressure, and status readbacks are displayed, but control buttons of GUI are disabled. "Setup" functionality of GUI is available read-only: parameters can be read, but can't be modified or uploaded to the controller.

3. While the controller is in "Idle" state with "Setup/Run" key in "Run" position, all the buttons on the controller are disabled.

4. While the controller is in "Idle" state and "Setup/Run" key is turned into "Setup" position the controller enters into "Setup" state. With GUI application connected "Setup" functionality of the GUI becomes available in read/write: parameters could be changed and uploaded to the controller. In "Setup" state, injection valve buttons GIS insertion button on GUI and are disabled Turning Setup/Run key into "Run" in "Setup" state should close all the valves, retract GIS, and return controller into "Idle" state.

5. While the controller is in "Idle" state and "Setup/Run" key is in "Setup" position, the physical buttons on front panel of the controller become enabled in "Service" regime. Pushing and holding physical button for 3 seconds or longer would make button flash on release of the button and bring up confirmation dialogue on GUI if the GUI is connected. Repeated pushing and holding the same button for 3 seconds or longer would open corresponding valve regardless of interlock and readback status and change button indication on GUI to "Open." Insertion of GIS is by same two-stage 3-seconds pushing and holding operation. While valve is open or GIS is inserted, repeat pressing on the same button for any duration should close the valve or retract GIS. Turning Setup/Run key into "Run" position while controller is in "Idle" state should close all the valves, retract GIS, and return the controller into "Idle" state.

6. While the controller is in "Idle" state with Setup/Run key in "Setup" position the "Reset" button on the back of the controller is enabled. If "Reset" button is pushed and held for 3 seconds or longer then on release of the button controller can switch into "Service" state.

7. Turning "Setup/Run" key into "Run" position from "Service" state can switch controller into "Enabled" state or "Ready" state.

8. While the controller in "Service" regime GUI buttons and front-panel controller buttons are operational in "Service" regime.

9. With the controller in "Enabled" status, if temperature and/or pressure readbacks are out of tolerance for any particular cartridge, then LED on corresponding button of the controller should be flashing, "Temp" and "Pressure" indicators next to virtual button on GUI should be red, and "Ready" LED on the front panel of the controller should be flashing. Once temperature/pressure readbacks get within tolerance then LED of corresponding button on the front panel should go "OFF" and "Temp" and "Pressure" indicators next to the corresponding Open/Close button on GUI should turn green. If there are any other interlocks Enabled then "Ready" LED on front panel of the controller should continue flashing. If all readbacks are within tolerance and no interlocks are Enabled then "Ready" LED becomes "ON" and the controller switches to "Ready" status.

10. If the controller is powered up and there is no connection to GUI then controller should operate normally in either "Run" or "Setup" state accordingly to "Setup/Run" key position and with front-panel button controls, using setup information stored in the controller. It should be possible to start normal operation of the controller by turning "Setup/Run" key to "Setup" position, pushing "Reset" button for 3+ seconds, waiting for heated/cooled/Peltier controlled cartridge temperature and pressure readbacks to enter tolerance range, and once all enabled interlocks are in "Enabled" they operate normally using front-panel buttons.

11. If the controller lost connection to GUI while operating in "Run" state it should continue operating normally with front-panel button controls.

12. If the controller lost connection to GUI while operating in "Setup" state it should close injection valves and switch to "Idle" status. Return from "Idle" status to "Enabled" is by manually turning Run/Setup key into "Setup" position and pressing "Reset" button for 3 seconds or longer. Return to "Ready" status is after checking all temperature and pressure readbacks within tolerance and no Enabled interlocks.

13. If GUI lost connection to the controller it should: (a) change connection status message to "Lost", (b) stop plotting graphs, (c) remain operational in view-only mode, and (d) keep checking for connection to controller every couple of seconds.

14. When GUI software is started it should display connection status "Establishing" and check for connection to the controller. If there is no connection it should display connection status message "Lost" and remain operational in view-only mode while checking for connection to the controller every couple of seconds.

15. When GUI software establishes connection with controller for the first time after software startup, it should display connection status "Verifying," read type of the GIS and setup values from the controller and compare with values stored on computer. If GIS type and setup values are the same then GUI should display connections status "Connected" and operate normally. If GIS type and setup values in the controller don't match information stored on the PC GUI software should display message "GUI/Controller Mismatch" and give three options: (a) Upload configuration from controller to GUI; (b) Download configuration from GUI to Controller; (c) Compare Controller to GUI configuration. Options (a) and (b) should save configuration for controller and GUI as text files for future reference and proceed, while (c) should open both files in Notepad++ and launch "Compare" plugin.

Controller and GUI Behavior in "Ready" and "Run" States.

Below are various examples of changes in state related to "Ready" and "Run" states.

1. In "Ready" state left-click on GUI injection button or pushing physical button on the front panel of the controller should open the corresponding valve if (a) GIS is extended, (b) valve is closed, and (c) there are no other incompatible valves open. Opening of the valve should (a) switch LED of the physical button on front panel of the controller to "ON", (b) change color of the GUI button from "dark" to "bright" and (c) change word on the GUI from "Closed" to "Injecting."

2. In "Ready" state left-click on GUI injection button or pushing physical injection button on the front panel of the controller when injection valve is closed and GIS is retracted should (a) bring pop-up dialogue with options to (a) open injection valve without extending GIS, (b) extend GIS and open injection valve after the extension, and (c) cancel the operation; (b) make LED on injection button and LED on Extend button of the controller flash with 2 Hz frequency. In this state pushing on physical injection button on front panel of the controller should open valve without extending the GIS and pop-up dialogue should disappear, pushing "Extend" button should extend GIS and open injection valve and pop-up dialogue should disappear, pushing both buttons simultaneously should cancel the operation and pop-up dialogue should disappear.

3. In "Ready" state opening any of the injection valves should switch controller from "Ready" state to "Injecting" state.

4. In "Injecting" state closing all injection valves should switch controller from "Injecting" to "Ready" state.

5. In "Injecting" state left-click on GUI injection button or pushing physical button on the front panel of the controller corresponding to open injection valve should close the valve. Closing the valve should (a) switch LED on the physical button on front panel of the controller to "OFF," (b) change color of the GUI button from "bright" to "dark," and (c) change word on the GUI button from "Injecting" to "Closed."

6. In "Ready" state left-click on GUI "Cold Cleanup" button should execute cold cleanup cycle. In "Injecting" state left-click on GUI "Cold Cleanup" button is ignored.

7. In "Injecting" state left-click on GUI "Hot Cleanup" button should execute hot cleanup at the time of the valve closing. If multiple (compatible) injection valve(s) is/are opened prior to, or after "Hot Cleanup" button was pressed, then hot cleanup is executed at the time of closing last injection valve regardless of the order in which injection valves were opened. In "Ready" state pressing GUI "Hot Cleanup" button is ignored.

8. In "Ready" state left-click on GUI "Extend/Retract" button or pushing physical "Extend/Retract" button on front panel of the controller should (a) extend GIS if it is retracted, causing LED on "Extend/Retract" button to flash with 0.5 Hz frequency during extension and switching LED "ON" after when GIS is extended, and (b) retract GIS if it is extended, causing LED on "Extend/Retract" button to flash with 0.5 Hz frequency during retraction and switching LED "OFF" after GIS is retracted.

9. In "Injecting" state if GIS is extended with at least one of injection valves open then left-click on GUI "Extend/Retract" button or pushing physical Extend/Retract button on the front panel of the controller should (a) bring pop-up dialogue with options to (a) retract GIS without closing injection valves, (b) close injection valves first and retract GIS, (c) cancel the operation; (b) make LEDs in physical "Inject/Close" button(s) corresponding to open valve(s) and "Extend/Retract" button on the front panel of the controller flash with 2 Hz frequency. If flashing "Inject/Close" button is pressed then injection valve(s) should close, GIS retract, and pop-up dialogue disappear. If flashing "Extend/Retract" button is pressed then GIS should retract without closing injection valve and pop-up dialogue should disappear. If flashing "Inject/Close" button is pressed simultaneously with flashing "Extend/Retract" button then operation should be cancelled and pop-up dialogue disappear.

10. In "Injecting" state with GIS retracted pushing GUI or physical "Extend/Retract" button should extend GIS causing LED on "Extend/Retract" button to flash with 0.5 Hz frequency during extension and switching LED "ON" when GIS is extended.

Controller and GUI Behavior in "Setup" and "Service" States.

Below are various examples of changes in state related to "Setup" and "Service" states.

1. When the controller is in "Setup" or "Service" state front panel buttons are operational in "Service" mode: Pushing and holding physical button for 3 seconds or longer would make button flash on release of the button and bring up confirmation dialogue on GUI if the GUI is connected. Repeated pushing and holding the same button for 3 seconds or longer would open corresponding valve regardless of interlock and readback status and change button indication on GUI to "Open." Insertion of GIS is by same two-stage 3-seconds pushing and holding operation. While valve is open or GIS is inserted, repeat pressing on the same button for any duration should close the valve or retract GIS.

2. When the controller is in "Setup" or "Service" state and GUI is connected the GUI application "Setup" functionality becomes available in read/write: parameters could be changed and uploaded to the controller. In "Setup" state injection valve buttons GIS insertion button on GUI and are operational in "Service" regime: if GUI button is pressed for 3 seconds or longer release of the button opens pop-up dialogue to confirm opening injection valve or extension of GIS. While dialogue is open corresponding button on the controller should start flashing rapidly. Upon confirmation the valve should open and/or GIS should extend regardless of readback and interlocks; light on the button should come "ON." While valve is open or GIS is inserted, repeat pressing on the same button for any duration should close the valve or retract GIS; light should return to the state it has accordingly to current status.

3. When the controller is in "Setup" or "Service" state left-click on GUI "Cold Cleanup" or "Hot Cleanup" buttons is executed in the same way as in "Ready" and "Injecting" states.

Controller Front Panel Button LED and Indicators

Below are various examples of changes in state related to changes using the control panel.

1. Run/Service LED on the front panel is "OFF" in "Idle" state, flashing 0.5 Hz in "Setup" and "Service" states, flashing 1 Hz in "Enabled" state, and "ON" in "Ready" and "Injecting" states.

2. "Ready" LED on the front panel is flashing 0.5 Hz in "Idle" and "Setup" states, flashing 1 Hz in "Service" and "Enabled" states if one of enabled readbacks is out of tolerance or one of enabled interlocks is Enabled, "ON" in "Service" state if all enabled readbacks are within tolerance and none of enabled interlocks are Enabled, and "ON" in "Ready" and "Injecting" states.

3. LED in GIS Extend/Retract button is "OFF" if GIS is retracted, "ON" if GIS is inserted, flashing 0.5 Hz while GIS is inserting or retracting, flashing 1 Hz if GIS is in "Error" state, i.e. neither inserted nor retracted for the period of time exceeding insertion/retraction time, or inserted and retracted at the same time, flashing 2 Hz if retraction was attempted with one or more injection valves open and no confirmation was given.

4. LEDs in "Inject/Close" buttons on front panel of the controller are "ON" when valve is opened, flashing 0.5 Hz after first 3-second hold while opening in "Service" or "Setup" mode, flashing 1 Hz in "Service" or "Enabled" mode if enabled temperature or pressure readback for the corresponding cartridge is out of tolerance, flashing 2 Hz if opening valve was attempted in "Ready" or "Injecting" state with GIS retracted and no confirmation was given, and "OFF" at all other times.

Software Safety Features

Below are various examples of changes in state related to safety features.

1. All buttons are connected through 100 mSec "debouncer," which would ignore changes of state of the button that are shorter then 100 mSec;

2. All interlocks are connected through 100 mSec "debouncer," which would ignore changes of state of the button that are shorter then 100 mSec;

3. Temperature and pressure readings for GUI graph are "real time" at the rate of controller sampling, however tolerance compliance or in-compliance is "filtered" over 2 seconds.

4. "Enable" button must go through "Released" and transition into "Activated" state in order to switch controller from "Idle" state to "Enabled" state or from "Setup" state to "Service" state.

5. "Setup" key must be in "Run" position and transition into "Setup" state to switch controller from "Idle" to "Setup" states and from "Enabled," or "Run" states into "Service" state.

6. All setup parameters are stored within controller. For displaying on GUI actual parameters are read from the controller.

7. All calculations and decision-making is happening within controller only; GUI serves only as indicator/monitor. For displaying on GUI all states and graphs are read from the controller.

8. Internal operation of the controller is in bits of temperature and/or pressure A/D with allowed range from 0 to 1023. Conversion from bits to temperature and/or pressure units for human readout is done on PC within GUI software only.

9. Internal operation of temperature control is in D/A bits with allowed range from 0 to 255.

Setup Functionality

The following present When controller is in "Idle," "Enabled," "Ready," and "Injecting" states, or if GUI is disconnected from the controller then right-click on corresponding GUI elements opens following configuration pop-ups in read-only mode. When the controller is in "Setup" or "Service" state and GUI is connected to the controller then right-click on corresponding GUI elements opens following configuration pop-ups in read/write mode, any changes are stored in configuration file and uploaded to controller.

1. Temperature units: K, C, F—applied to all temperature settings and readbacks; change of unit should convert all settings and readback values.
2. Pressure units: Mbar, Torr, Pa—applied to all pressure settings and readbacks; change of unit should convert all settings and readback values.
3. Chamber vacuum HW interlock: E—Enabled; D—Disabled;
4. Cartridge vacuum HW interlock: E—Enabled; D—Disabled;
5. Insert HW interlock: E—Enabled; D—Disabled;
6. Chamber Vacuum Readback: A—Enabled; D—Disabled; Default is "D," not used now
   a. Voltage to pressure table should be stored, graph color should be selectable
7. Chamber Vacuum Min.: Lowest Chamber Vacuum to operate (only when Readback is A)
8. Chamber Vacuum Max: Highest Chamber Vacuum to operate (only when Readback is A)
9. Nozzle Pressure Readback: A—Enabled; D—Disabled; Default is "D," not used now
   a. Voltage to pressure table should be stored, graph color should be selectable
10. Nozzle Pressure Min.: Lowest Nozzle Pressure to operate (only when Readback is A)
11. Nozzle Pressure Max.: Highest Nozzle Pressure to operate (only when Readback is A)

12. Cartridge setup for three types of cartridges (H—heated, C—cooled, P—Peltier)
    a. Min. Readback Temperature; this is thermistor range definition
    b. Max. Readback Temperature; this is thermistor range definition
    c. Voltage to temperature (thermistor readback) table;
    d. Overheat Limit: Max. Temp to operate; Limit puts controller into Idle, error message
    e. Overcool Limit: Min. Temp to operate; Limit puts controller into Idle, error message
13. Gas Setup for four precursor cartridges:
    a. Cartridge ID—read-only field;
    b. Gas: Precursor name or chemical formula "0" to disable;
    c. Color: Defines color of the On/Off button on the GUI and color of temperature graph;
    d. Type of cartridge: H (Heated), C (Cooled), P (Peltier), A (Ambient)
    e. Temp Setpoint: Temperature for operation;
    f. Temp Tolerance: Temperature range for operation; default +/−1C.
    g. Precursor Pressure Readback: A—Enabled; D—Disabled; Default is "D," not used now
        i. Voltage to pressure table should be stored, graph color should be selectable
    h. Precursor Pressure Min.: Lowest Nozzle Pressure to operate (only when Readback is A)
    i. Precursor Pressure Max.: Highest Nozzle Pressure to operate (only when Readback is A)
    j. Compatibility: ID of cartridges which could be opened simultaneously with current one;
    k. Opening Delay: minimum time after closing injection valve on another cartridge before current cartridge could be opened; Sec., 0 to 1000
    l. Opening Cleanup Skip Delay: minimum time after closing injection valve on another cartridge to skip opening cleanup; Sec., 0 to 1000
    m. Opening Cleanup: Yes/No; if "Yes" then cold cleanup cycle is executed prior to opening injection valve on the cartridge; if "No" then no cleanup cycle.
    n. Opening Cleanup Duration: Seconds, 10 to 1000. This setting overrides duration in cold cleanup cycle setup.
    o. Closing Cleanup: Hot/Cold/No; if "Hot" or "Cold" then corresponding cleanup cycle is executed after closing the cartridge, if "No" then no cleanup cycle.
    p. Closing Cleanup Duration: Seconds, 10 to 1000. This setting overrides duration in hot cleanup cycle setup.
    q. Charge: Mass of precursor charge, Gram;
    r. Depletion Rate: Gram/Sec
    s. "Reset" button for "Open Time" and "Depletion" Counters
14. Extend/Retract Setup:
    a. Extend Readback: 1—Enabled high; 0—Enabled low; D—Disabled
    b. Retract Readback: 1—Enabled high; 0—Enabled low; D—Disabled
    c. Timer for extend/retract action, Sec: Range 1 Sec-30 Sec, default value is 5 Sec
    d. Extend Cleanup Duration (Seconds, "0" to disable); period of time to execute cold cleanup cycle during GIS insertion. If both cartridge opening and extend cleanups are specified then extend cleanup is executed first, followed by cartridge opening cleanup.
    e. Retract Cleanup Duration (Seconds, "0" to disable); period of time to execute cold cleanup cycle during GIS retraction. If both cartridge closing cleanup and retract cleanup are specified then cartridge cleanup is executed first, followed by retract cleanup.
15. Nozzle setup:
    a. Temp Color: Defines color of nozzle temperature graph
    b. Temp Setpoint: Temperature for nozzle operation;
    c. Temp Tolerance: Temperature range for operation; default +/−1C. If nozzle temp is out of tolerance cartridge valves don't open and "Ready" indicator is flashing on Controller.
    d. Min. Readback Temperature; this is thermistor range definition
    e. Max. Readback Temperature; this is thermistor range definition
    f. Voltage to temperature (thermistor readback) table;
    g. Overheat Limit: Max. Temp to operate; Limit puts controller into Idle, error message
    h. Overcool Limit: Min. Temp to operate; Limit puts controller into Idle, error message
    i. Nozzle Pressure Readback: A—Enabled; D—Disabled; Default is "D," not used now
        i. Voltage to pressure table should be stored, graph color should be selectable
    j. Nozzle Pressure Min.: Lowest Nozzle Pressure to operate (only when Readback is A)
    k. Nozzle Pressure Max.: Highest Nozzle Pressure to operate (only when Readback is A)
16. Cold Cleanup Cycle Setup:
    a. Cleanup Cartridge ID and Type; Default is 4 and Ambient;
    b. Delay: Time to delay opening cleanup cartridge valve after closing injection valve; mSec 0 to 10,000
    c. Burst: Time to open cleanup cartridge injection valve during cycle, mSec; 1 to 10,000
    d. Cycle: Time of the cycle, mSec 1 to 10,000. Injection valve closes after Burst until end of the cycle If Burst>=Cycle then injection valve stays open for the duration of the cycle.
    e. Duration: Duration of Cold Cleanup Cycle by pressing GUI button, Seconds, 10 to 1200
17. Hot Cleanup Cycle Setup:
    a. Cleanup Cartridge ID and Type; Default are 4 and Ambient;
    b. Lead: Time to delay closing precursor injection valve prior to first opening of cleanup cartridge injection valve, mSec, 1000 to 0
    c. Burst: Time to open cleanup cartridge valve during cycle, mSec; 1 to 10,000
    d. Cycle: Time of the cycle, mSec 1 to 10,000. Valve closes after Burst until end of the cycle If Burst>=Cycle valve stays open for the duration of the cycle.
    e. Duration: Duration of Hot Cleanup Cycle by pressing GUI button, Seconds, 10 to 1200
18. Graph and Log Setup:
    a. Time interval for recording when one or more cartridge valve(s) open. All Enabled readbacks and statuses are recorded in this case. 0.1 Sec, 1 Sec, 10 Sec.
    b. Time interval for monitoring change in status of predefined parameters to make a recording if all cartridge valves are closed. 1 Sec, 10 Sec, 30 Sec
    c. Readback parameters to check when all cartridge valves are closed. Radio button selection d. Number of log files to keep, or duration of time?
19. Temperature PID setup (Nozzle and each type of cartridge):
   a. C $V_{Est}$—Voltage Estimation Constant
   b. PID Control Window (0.1 . . . . 5)×Tolerance;
   c. PID Update Rate (mSec);
   d. Smoothing Constant (0—no smoothing, 1—sensor ignored);
   e. $I_{Lim}$—Integration Limit;
   f. P—Proportional Gain;
   g. I—Integral Gain;
   h. D—Differential Gain;

Numerous modifications and alternative embodiments of the present disclosure will be apparent to those skilled in the art in view of the foregoing description. Accordingly, this description is to be construed as illustrative only and is for the purpose of teaching those skilled in the art the best mode for carrying out the present disclosure. Details of the structure may vary substantially without departing from the spirit of the present disclosure, and exclusive use of all modifications that come within the scope of the appended claims is reserved. Within this specification, embodiments have been described in a way which enables a clear and concise specification to be written, but it is intended and will be appreciated that embodiments may be variously combined or separated without parting from the scope of the present disclosure. It is intended that the present disclosure be limited only to the extent required by the appended claims and the applicable rules of law.

What is claimed is:

1. A gas injection system comprising:
   an external housing;
   a plurality of cartridge housings disposed within the external housing and being configured to accept a plurality of precursor cartridges comprising one or more precursor materials, the plurality of precursor cartridges being heated so that one or more precursor gases are generated from the one or more precursor materials and;
   a nozzle extending from the external housing, the nozzle having a tip configured for insertion into a sample chamber of a material processing apparatus;
   a delivery line in fluid communication with the nozzle and the sample chamber; and
   a plurality of three-way valves;
   the delivery line comprising a single delivery line such that the plurality of three-way valves are disposed along the single delivery line in a serial arrangement to fluidly connect the plurality of precursor cartridges to the single delivery line in series to selectively deliver one or more precursor gases produced from the one or more precursor materials to the sample chamber,
   wherein the delivery line is surrounded between the plurality of cartridge housings and the nozzle by a thermally conductive sheath, the thermally conductive sheath being in thermal communication with the plurality of cartridge housings such that the thermally conductive sheath conducts the heat from the plurality of cartridge housings toward the nozzle to maintain the delivery line at a preselected temperature to prevent condensation of the one or more precursor gases in the delivery line.

2. The gas injection system of claim 1, wherein the external housing forms a vacuum envelope around the plurality of precursor cartridges.

3. The gas injection system of claim 1, wherein each cartridge housing includes an integrated valve to fluidly connect one or more of the plurality of precursor cartridges disposed in the plurality of cartridge housings to the nozzle.

4. The gas injection system of claim 1, wherein the delivery line is fluidly connected to one or more injection capillaries disposed in the nozzle for delivery of the one or more precursor gases to the sample chamber.

5. The gas injection system of claim 4, wherein the one or more injection capillaries are configured for simultaneous injection of multiple precursor gases into the sample chamber.

6. The gas injection system of claim 1, wherein each of the plurality of cartridge housings includes one or more temperature control elements configured to operate independently from one or more heating elements associated with other cartridge housings to maintain each of the plurality of precursor cartridges at a temperature selected for sublimation of the precursor gas in that precursor cartridge.

7. The gas injection system of claim 1, wherein the nozzle is configured to be maintained at a thermal gradient along a length of the nozzle.

8. The gas injection system of claim 7, wherein the thermal gradient increases toward the tip of the nozzle.

9. The gas injection system of claim 1, wherein the nozzle and the external housing are configured to form a vacuum envelope around the one or more precursor cartridges and the delivery line.

10. The gas injection system of claim 4, wherein the one or more injection capillaries are surrounded by the thermally conductive sheath.

11. A gas injection system comprising:
    an external housing configured to hold a plurality of cartridge housings, each cartridge housing configured to accept one of a plurality of precursor cartridges comprising one or more precursor materials, the external housing being configured to form a vacuum envelope around the plurality of cartridges housings;
    a nozzle extending from the external housing, the nozzle having a tip configured for insertion into a sample chamber of a material processing apparatus,
    the plurality of precursor cartridges being heated so that one or more precursor gases are generated from the one or more precursor materials and being fluidly connected to a delivery line in fluid communication with the nozzle and the sample chamber to selectively deliver the one or more precursor gases produced from the one or more precursor materials to the sample chamber;
    a thermally conductive sheath disposed along the delivery line and extending between the plurality of cartridge housings and the nozzle, the thermally conductive sheath being in thermal communication with the plurality of cartridge housings such that the thermally conductive sheath conducts the heat from the plurality of cartridges toward the nozzle to maintain the delivery line at a preselected temperature to prevent condensation of the one or more precursor gases in the delivery line; and
    a plurality of three-way valves, wherein the delivery line comprises a single delivery line such that the plurality of three-way valves are disposed along the single delivery line in a serial arrangement to fluidly connect the plurality of precursor cartridges to the single delivery line in series.

12. The gas injection system of claim 11, wherein the delivery line is fluidly connected to one or more injection capillaries disposed in the nozzle for delivery of the one or more precursor gases to the sample chamber, the one or more injection capillaries are surrounded by the thermally conductive sheath.

13. A gas injection system comprising:
- an external housing configured to hold a plurality of cartridge housings configured to accept a plurality of precursor cartridges comprising one or more precursor materials, wherein, the plurality of cartridge housings are heated so that the one or more precursor materials produce one or more precursor gases;
- a nozzle extending from the external housing, the nozzle having a tip configured for insertion into a sample chamber of a material processing apparatus;
- a delivery line in fluid communication with the nozzle; and
- a plurality of three-way valves,
- wherein the delivery line comprises a single delivery line such that the plurality of three-way valves are disposed along the single delivery line in a serial arrangement to fluidly connect the plurality of precursor cartridges to the single delivery line in series,
- wherein the delivery line is surrounded by a thermally conductive sheath, the thermally conductive sheath being in thermal communication with the plurality of cartridge housings such that the thermally conductive sheath conducts the heat from the plurality of cartridge housings toward the nozzle to maintain the delivery line at a preselected temperature to prevent condensation of the one or more precursor gases in the delivery line, and
- wherein the plurality of three-way valves are supplied with a control signal to open and close each of the plurality of three-way valves to selectively fluidically connect one or more of the plurality of cartridges to the delivery line to enable fluid communication between the plurality of precursor cartridges and the nozzle, such that the one or more precursor gases are selectively delivered to the sample chamber.

* * * * *